United States Patent
Gilan et al.

(10) Patent No.: US 12,420,479 B2
(45) Date of Patent: Sep. 23, 2025

(54) SYSTEMS FOR PRINTING VISCOUS MATERIALS USING LASER ASSISTED DEPOSITION

(71) Applicant: Reophotonics, Ltd., Modiin (IL)

(72) Inventors: Ziv Gilan, Kfar-harif (IL); Michael Zenou, Hashmonaim (IL); Guy Nesher, Nes Ziona (IL)

(73) Assignee: Reophotonics, Ltd., Modiin (IL)

( * ) Notice: Subject to any disclaimer, the term of this patent is extended or adjusted under 35 U.S.C. 154(b) by 436 days.

(21) Appl. No.: 18/065,174

(22) Filed: Dec. 13, 2022

(65) Prior Publication Data

US 2023/0202098 A1    Jun. 29, 2023

Related U.S. Application Data

(60) Provisional application No. 63/265,950, filed on Dec. 23, 2021.

(51) Int. Cl.
| | |
|---|---|
| *B29C 64/268* | (2017.01) |
| *B29C 35/08* | (2006.01) |
| *B29C 59/04* | (2006.01) |
| *B29C 64/135* | (2017.01) |
| *B29C 64/245* | (2017.01) |

(Continued)

(52) U.S. Cl.
CPC ........ *B29C 64/135* (2017.08); *B29C 35/0805* (2013.01); *B29C 59/046* (2013.01); *B29C 64/245* (2017.08); *B29C 64/268* (2017.08); *B29C 2035/0827* (2013.01); *B29C 2037/906* (2013.01); *B33Y 10/00* (2014.12); *B33Y 30/00* (2014.12)

(58) Field of Classification Search
CPC .................................................. B29C 64/268
See application file for complete search history.

(56) References Cited

U.S. PATENT DOCUMENTS

| | | | | |
|---|---|---|---|---|
| 4,752,455 A | * | 6/1988 | Mayer | B23K 20/08 |
| | | | | 219/121.6 |
| 4,895,735 A | * | 1/1990 | Cook | C23C 14/048 |
| | | | | 257/E21.333 |

(Continued)

FOREIGN PATENT DOCUMENTS

CN    110666169 A  *  1/2020  .............. B22F 10/00

OTHER PUBLICATIONS

Machine translation of CN 110666169, retrieved from USPTO database Apr. 11, 2025 (Year: 2025).*

(Continued)

*Primary Examiner* — Timothy Kennedy
(74) *Attorney, Agent, or Firm* — Ascenda Law Group, PC

(57) ABSTRACT

In systems for printing a viscous material, the printing and post processing of the viscous material are performed sequentially one after another. In an initial step, a viscous material is printed on a sample mounted on a receiver substrate using a donor module and a laser scanner, and then the donor module is replaced with a post processing system for performing a post processing operation (and vice versa). Multiple post processing operations can be performed, and multiple different materials can be printed on the same layer. The systems can increase the speed, resolution and diversity of materials printed on the same sample, and opens the possibilities for new designs.

18 Claims, 20 Drawing Sheets

(51) Int. Cl.
*B29C 37/00* (2006.01)
*B33Y 10/00* (2015.01)
*B33Y 30/00* (2015.01)

(56) References Cited

U.S. PATENT DOCUMENTS

| | | | | |
|---|---|---|---|---|
| 6,025,110 | A * | 2/2000 | Nowak | C23C 14/0005 |
| | | | | 430/269 |
| 10,144,034 | B2 | 12/2018 | Zenou | |
| 11,999,107 | B2 * | 6/2024 | Moridi | B22F 12/33 |
| 2005/0015175 | A1 * | 1/2005 | Huang | B33Y 30/00 |
| | | | | 700/121 |
| 2014/0048519 | A1 * | 2/2014 | Gadd | B23K 26/16 |
| | | | | 219/121.84 |
| 2015/0202687 | A1 * | 7/2015 | Pialot | B22F 3/003 |
| | | | | 425/174 |
| 2016/0233089 | A1 * | 8/2016 | Zenou | C23C 26/02 |
| 2017/0210142 | A1 * | 7/2017 | Kotler | B23K 26/0676 |
| 2018/0015671 | A1 * | 1/2018 | Sandstrom | C23C 14/56 |
| 2020/0102529 | A1 * | 4/2020 | Guillemot | B33Y 80/00 |
| 2020/0180225 | A1 | 6/2020 | Zenou et al. | |
| 2021/0237184 | A1 | 8/2021 | Zenou et al. | |
| 2021/0267067 | A1 | 8/2021 | Gilan et al. | |
| 2021/0331196 | A1 | 10/2021 | Zenou et al. | |
| 2021/0385951 | A1 | 12/2021 | Zenou et al. | |

OTHER PUBLICATIONS

International Search Report and Written Opinion mailed Mar. 21, 2023, from ISA/European Patent Office, for International Patent Application No. PCT/IB2022/062246 (filed Dec. 14, 2022), 11 pgs.
International Preliminary Report on Patentability dated Mar. 26, 2024, from the IPEA/European Patent Office, for International Patent Application No. PCT/IB2022/062246 (filed Dec. 14, 2022), 5 pgs.

* cited by examiner

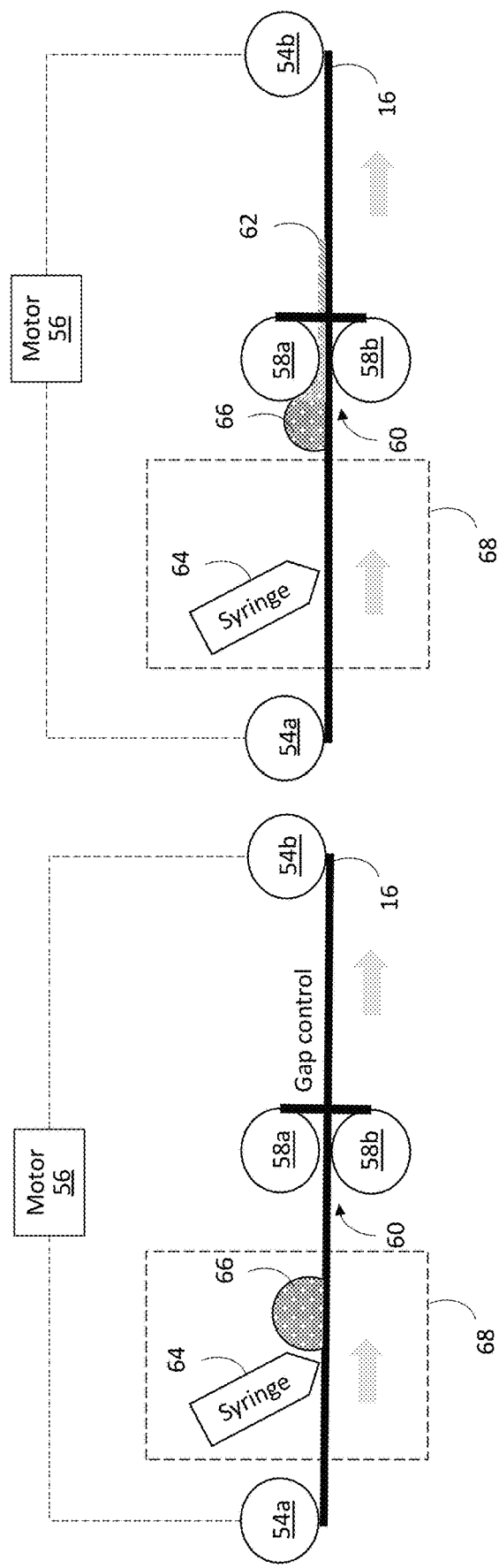

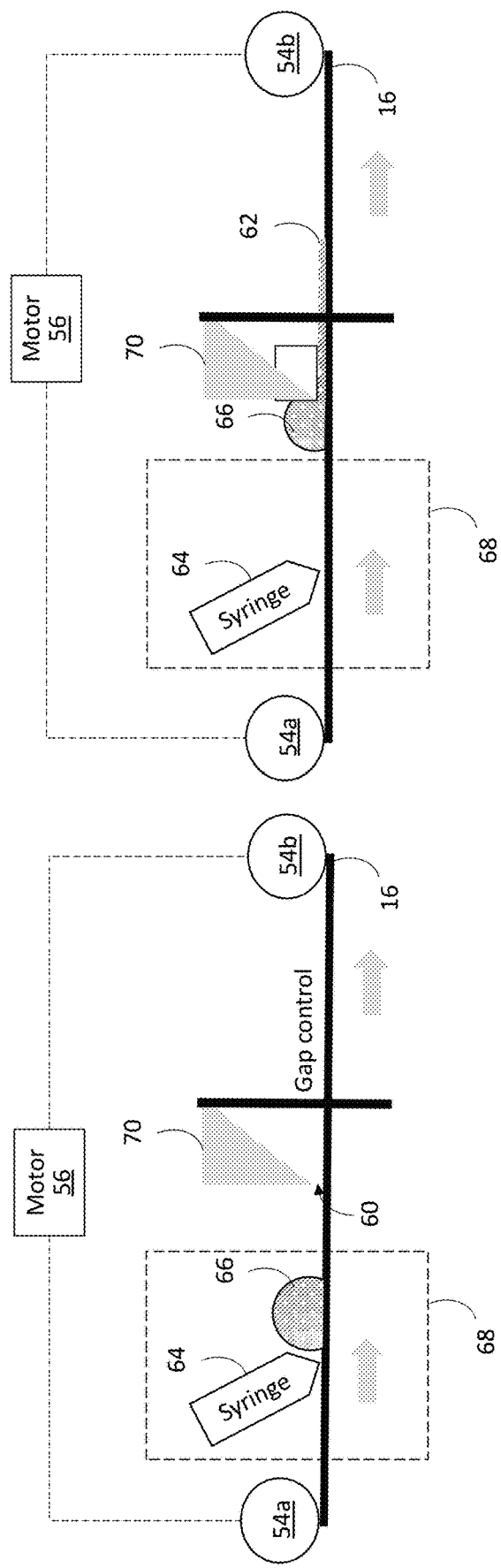

SYSTEMS FOR PRINTING VISCOUS MATERIALS USING LASER ASSISTED DEPOSITION

RELATED APPLICATIONS

This application is a NONPROVISIONAL of, claims priority to, and incorporates by reference U.S. Provisional Application No. 63/265,950, filed Dec. 23, 2021.

FIELD OF THE INVENTION

The present invention relates to systems for printing a viscous material, and more particularly relates to systems in which the printing and the post processing of the viscous material are performed sequentially one after another.

BACKGROUND

In conventional techniques for printing viscous materials, two main approaches have been used: screen printing, and dispensing via a dispensing system. In screen printing, ink is applied to a surface by forcing the ink through a fine mesh screen, which may be formed by stretching silk, a synthetic substitute or other fabric tightly over a frame. Patterns (i.e., images) in the printed material may be created by blocking parts of the screen with stencils created by hand-drawn or photographic methods. Screen printing is one of the oldest printing techniques. The basic equipment is inexpensive and large surfaces can be printed using meshes with large dimensions. However, in most of today's printed electronics with conductive patterns formed from carbon or silver inks, screen printing has not been able to cope with the types of inks, and/or produce, in one printing pass, layers that are thick enough to provide the requisite conductance.

In printed electronics, the application of screen printing has therefore been limited to certain applications, such as manufacturing membrane keyboards and radio frequency identification (RFID) antennas. Screen printing has also been used for printing dielectric, phosphor and passivation layers of alternating current (AC) electroluminescent printed wide area displays. In contrast to screen printing, many faster printing processes cannot handle the printing of materials over wide areas, and therefore screen printing has been one of the most important tools for printing materials in microelectronic applications. Rotary screen printing is sometimes preferred over conventional screen printing because it offers an increased throughput as compared to the lower throughput of conventional screen printing.

However, screen printing has its associated drawbacks. While screen printing is ideal for manufacturing products in high volumes, it is not very cost effective for the manufacturing of products that are only needed in low quantities. The setup time of screen printing is complex and involved, so printing in low quantities may not necessarily provide a cost-effective result. Another problem of screen printing is its ability to print only one material at a time during the printing process. That is, screen printing typically does not permit a second material to be printed before the first material is dried or cured. Additionally, it is not possible to use screen printing to print materials that are used as adhesives of components. Another limitation of screen printing is caused by the uniform size of the apertures located in the screen. As such, it is only possible to print a material with identical droplet sizes in the same printing layer, but many times, it is necessary to print a material with different droplet sizes in the same printing layer. To address such issue, the current solution in the art is to print some of the droplets with a first droplet size by screen printing and other droplets with a second droplet size by another technique.

The reliability of screen printing is lower than dispensing via a dispensing system and for that reason, dispensing is often used in the electronics market. An automated dispensing of electronic materials in fluidic form is employed across the full range of electronics manufacturing, from board-level assembly to semiconductor applications. The materials dispensed can range from a very low (water like) to a very high (toothpaste like) viscosity and encompass many different functions. These include solder paste to electrically connect components, encapsulants to protect devices from atmospheric conditions, thermal interface materials (TIMs) to help dissipate heat from parts, and adhesives to attach parts to a substrate or assembly.

Each material may be dispensed in a range of dot sizes or complex lines and patterns depending on the application requirements. Common applications include underfill, selective coating, fastening, dam and fill, potting and dielectric dispense. The shape and function are determined by the type of pump head type mounted on the dispenser of the dispensing system. Moreover, a dispenser may be fitted with more than one pump head type to perform multiple dispense operations on a single substrate.

When electronic materials such as solder paste are screen printed onto a printed circuit board (PCB), for example, a large area can be printed at once. Dispensing via a dispensing system in most cases is slower than screen printing, as dispensing systems typically print one dot at a time leading to a slow throughput. Therefore, minimizing the cycle time between the printing of each dot in a dispensing system is the key to achieving a reasonable production throughput.

The present invention improves upon these and other prior approaches for depositing materials onto a sample.

SUMMARY OF THE INVENTION

The current invention provides an improved system for depositing materials digitally (e.g., via digital/computer control of a laser) with a better resolution and repeatability than the analog (e.g., manual) screen-printing system and in a much faster way than the best dispensing systems. Since the improved system employs a continuous sequence production, the rate of production and its versatility is greatly improved over prior systems. Multiple materials can be introduced for each printed layer and no cleaning is needed at the end of the production.

The present inventors have recognized that it is desirable to print digitally (e.g., via digital/computer control of a laser) viscous materials and still maintain a high-speed production. To that end, the inventors have integrated the printing and the post processing processes into a single system, thereby addressing printing speed while avoiding limiting the process to depositing a single material or a single post process operation.

In some embodiments of the invention, the printing system employs a donor module that is laterally non-translatable, and in other embodiments, the printing system employs a donor module that is laterally translatable. The donor module includes a donor substrate (e.g., a film) that is translated on a plurality of rollers as the printing of material occurs. The donor module may also include a coating system that is used to uniformly spread out material that is deposited onto the donor substrate by a dispenser system. The coating system may be located inside a closed cell with a controlled environment so as to prolong a pot life of the material. The coating system may include rollers or knives that form a gap through which the donor substrate is translated by a motor, such translation through the gap applying pressure to the dispensed material so as to form a layer of the dispensed material on the donor substrate with a uniform thickness. After the donor substrate has been coated with the material, the rollers or knives are configured to increase the height of the gap prior to translating the donor substrate from the coating area to the printing area.

In some embodiments of the invention, a transport unit of the system provides several axes of motion for spatially controlling the location of tools utilized during both the calibration processes and post processing operations.

In some embodiments of the invention, the donor substrate includes a film that is coated with the material. The printing discussed herein involves directing a laser beam onto a donor substrate that has been coated with the material, in order to eject (or transfer) droplets of the material from the donor substrate onto a sample mounted on a receiver substrate. Such a process may be referred to as laser assisted deposition (LAD).

In some embodiments of the invention, the receiver substrate is a plate holder that can move in both the X and Y directions on a surface of the stage that is fixed in the Z direction. That surface of the stage is the reference surface for all other surfaces in the system and the receiver substrate can move to all the areas of the system. In that way, the receiver substrate can hold a sample and transport it to any sub-system for both printing and post processing.

In embodiments of the invention with the laterally non-translatable donor module, the axis of motion of the donor module is only in the Z direction. However, since the height of the legs on which the donor module is mounted can be independently adjusted via motors, the surface of the donor substrate can additionally be adjusted in two angles (theta and phi angles on the X and Y axes, respectively). Using those motors, the surface of the donor substrate can be adjusted to be parallel to the surface of the receiver substrate in a repeatable and accurate manner.

In some embodiments of the invention, the axis of motion of the laser used to eject (or print) material from the donor substrate onto the sample is also only in the Z direction. However, similar to the donor module, the laser is mounted on height-adjustable legs (controlled with motors), allowing the focal plane of the laser to be adjusted parallel to the surface of the receiver substrate.

In some embodiments of the invention, the coating process for the donor module comprises dispensing material on the donor substrate (e.g., film) of the donor module, and translating the donor substrate through a gap formed by two rollers (or knives) to generate a uniform layer of the material on the donor substrate with a desired thickness.

In some embodiments of the invention, the material is dispensed on the donor substrate (e.g., film) by a syringe containing the material or by any other dispensing apparatus.

In some embodiments of the invention, to achieve a better uniformity of the material, the material is also dispensed onto the donor substrate (e.g., film) using a raster motion (i.e., translating the dispensing module laterally in a back and forth manner while the donor substrate is translated in a direction perpendicular to the lateral motion of the dispensing module), creating lines of material deposited on the donor substrate (as compared to other coating methods which dispense dots of material on the donor substrate).

In some embodiments of the invention, the donor module includes two donor substrates and therefore can be used to print two different materials onto the sample. The dispensing module, in turn, may contain two dispensing units, each of which is laterally translated in a back and forth manner with its own motor to create a raster motion with respect to a corresponding donor substrate that is translated in a direction perpendicular to the lateral motion of the respective dispensing units.

In some embodiments of the invention, a camera is used to inspect the surface of the sample before and/or after the printing of the material onto the sample. In embodiments with a receiver substrate that is translatable in the X and Y directions, the camera may be fixed in the X and Y dimensions, but is moveable in the Z direction so as to adjust its focal plane to coincide with the sample surface. The camera can also contain a zoom lens to increase the inspection resolution.

In some embodiments of the invention, two post processing units are optionally placed inside the system: an ultraviolet (UV) curing module and a drying unit. The UV curing module is used for curing UV sensitive materials after those materials have been deposited on the sample. The drying unit is used for curing heat sensitive materials after those materials have been deposited on the sample.

In some embodiments of the invention, the UV curing module may contain a UV light source to emit UV light at a desired wavelength and a gas inlet to introduce a gas that improves the curing speed of the deposited material. In scenarios where oxygen inhibits the UV curing of the deposited material, the gas can be an inert gas for displacing the oxygen in the atmosphere so as to generate a low oxygen environment just above the sample within which the newly deposited material is UV cured.

In embodiments with a laterally non-translatable donor module, the area between the two donor substrates of the donor module can be utilized for laser post processing operations, including sintering and/or ablation. In other words, such area may define a narrow window, through which a laser can be scanned in order to sinter and/or ablate the sample and/or materials deposited onto the sample.

In some embodiments of the invention, a metallic material that is deposited by LAD on the sample can be sintered to increase the conductance of the metallic material (e.g., create a better conduction line) using the same laser that was used to print the metallic material from the donor substrate onto the sample. The metallic material may come in a paste-like substance that is formed by a mixture of small metal particles and solvent. After the metallic material has been deposited on the sample, the solvent is removed by applying heat to the deposited material, resulting in small clumps of the small metal particles. Therefore, the conductivity of the metal particles, at least initially, is not the same as the conductivity of a uniformly solid form of the metal, because the electrons of the metal have a long path to travel from one end of the deposited material to the other. For that reason, the laser is used to sinter and melt the particles together so as to create a better interaction between neighboring metal particles and increase the overall conductivity of the printed lines.

In some embodiments of the invention, ablation of the deposited material is performed in order to remove portions of unwanted material (e.g., to increase the smoothness of a surface). For example, ablation may be used to repair a mistake on the deposited material that occurred as a result of a printing mistake or to repair a mistake on the sample that was introduced in a previous stage of the sample formation process. Ablation can also be used to enhance the resolution of certain portions of the sample for which enhanced resolution would be beneficial.

In some embodiments of the invention, the donor module is laterally translatable which provides several advantages as compared to a donor module that is not laterally translatable. The main advantage is the ability to print, inspect and post-process the sample with the sample fixed in place, which can increase the resolution and the repeatability of the different processes (e.g., the printing, inspection and post-processing processes). To clarify, in both embodiments, the donor module may be translatable in the vertical (Z) direction; however, the laterally translatable donor module is also translatable in the lateral (X) direction, which is perpendicular to the vertical (Z) direction.

In some embodiments of the invention, the quality of the coating on the donor substrate can be inspected when the donor module is translated from the printing area (i.e., above the receiver substrate) to the coating area (i.e., under the dispensing system). After a top facing surface of the donor substrate has been coated by the dispensing system (e.g., using syringes containing the material), the donor substrate makes an approximately 180° turn about a roller, causing the coated surface of the donor substrate (upstream of the roller) to face downwards (downstream of the roller). Subsequently, when the donor module is translated from the coating area to the printing area, a bottom camera (i.e., a camera disposed underneath the donor substrate) can be used to inspect the coating to determine a quality of the coating on the donor substrate. Such an inspection process enables a better print quality control.

In some embodiments of the invention, the dispensing system is not fixedly attached to the coating system. In such an embodiment, the donor module (with the coating system) is placed in a printing area during the printing operation. When the coating on the donor substrate has been depleted, the donor module can be translated from the printing area to the coating area (disposed adjacent to the printing area), where material is dispensed onto the donor substrate, and then the donor substrate can be passed through the gap of the coating system to spread out the dispensed material into a new uniform coating on the donor substrate. After the donor substrate has been coated, it is inspected immediately by the bottom camera and sent to the printing area for further printing. In the event that inspection by the bottom camera reveals that the coating quality is not satisfactory, the donor substrate may be sent back to the coating area and recoated. The location of the coating area off to the side of the printing area allows the dispensing system to take up more room without interfering with the printing process. In such case, the dispensing system may include more syringes (e.g., 5 syringes), allowing the dispensing of many different materials.

In some embodiments of the invention, other sub-systems can be moved to the printing area using the same transport unit (e.g., including rails) that is used to laterally translate the donor module. Therefore, drying, inspection or UV curing of the deposited material can be performed at the same location as the donor module was located during the printing operation. To provide an additional degree of freedom in movement (e.g., for each of the subsystems to move all over the printing area), another axis can be added to the transport unit, in the vertical (Y) direction.

In some embodiments of the invention, the camera is moveable about three axes, the Z axis for focusing the camera on the sample surface and the X-Y axes for positioning the camera with respect to different locations on the sample surface.

In some embodiments of the invention, the drying unit and the UV curing module can also be equipped to move about three axes, but the position axes (X and Y) are the most important for those sub-systems.

In some embodiments of the invention, it is also possible for the dispensing system to dispense additional materials or to include a complex syringe system. For example, a complex syringe system may be used to dispense two-component (2 k) materials like epoxy that must be mixed in the syringe before being dispensed onto the donor substrate. In such complex syringe systems, the syringe may need to be replaced occasionally.

In some embodiments of the invention, the dispensing system includes a purging cup to collect residual material from the complex syringe system, in order to decrease the number of times the syringe needs to be replaced.

In some embodiments of the invention, a drying and suction assembly includes a drying unit that is configured to perform a drying operation, and a suction unit that surrounds the drying unit. During an ablation step, the drying unit may be turned off and rotated about a hinge (e.g., flipped up) so as to expose a central cavity (e.g., window) of the suction unit through which a laser may be transmitted to perform ablation at the same time as the suction operation.

In some embodiments of the invention, the drying is performed by delivering a heated gas (e.g., hot air) onto the surface of the sample from the drying unit (e.g., similar to a hair dryer). The heated gas may be distributed uniformly over the sample (and/or printing area) via holes on the bottom surface of the drying unit. The hot gas may be evacuated from the sample (and/or printing area) via the holes disposed on the bottom surface of the suction unit and/or other holes that are disposed on the bottom surface of the drying unit. In some embodiments of the invention, the drying and suction assembly is positioned via a transport unit that enables the drying and suction assembly to be transported to and from an area of the sample that requires suction and/or heating.

The suction unit may have several applications. First, the suction unit may be used to remove debris from the sample surface while the heating unit and/or the laser scanner are not in use. Second, the suction unit may be used concurrently with the drying unit. In such case, a hot gas may be delivered by the drying unit towards the sample surface and the suction unit may be used to evacuate the hot gas (e.g., treating the hot gas as an exhaust gas). Third, the suction unit may be used concurrently with the laser scanner. In such case, the drying unit may be flipped up to expose the window of the suction unit; a laser scanner may direct and scan a laser through the suction window in order to ablate or sinter the sample and/or material deposited on the sample; and the suction unit can collect and remove any debris that is created by the ablation and/or sintering.

To clarify, while the donor module may be fixed in the lateral (X) direction in one of the embodiments during the printing and coating operations, this donor module may still be translated in the lateral (X) direction during a maintenance phase. More specifically, such donor module may be mounted on a drawer mechanism that allows the donor module to be translated in the lateral (X) direction along the rails of the drawer mechanism until the donor module reaches a position that it can be lifted out from the drawer and removed for maintenance. To clarify, the drawer of the drawer mechanism may include a bottom supporting surface that supports a bottom rim of the donor module, but at the same time includes an opening in the bottom supporting surface. This opening exposes the donor substrate to the top surface of the sample, allowing material to be ejected from the donor substrate onto the sample during a printing operation.

In some embodiments of the invention, after the donor substrate has been coated, the donor substrate is positioned in the lower part of the coating system, with the coated surface facing the receiver substrate.

In some embodiments of the invention, one or more cameras can be used to inspect the sample before and after the printing operation in one or more magnification settings.

In some embodiments of the invention, one camera with several selectable magnifications may be utilized, or several cameras, each with a corresponding fixed magnification, may be utilized for the convenience of the user. Such cameras may be used (in conjunction with the transport unit) to position the donor substrate in the X and Y dimensions.

In some embodiments of the invention, the system includes a 3 dimensional (3D) sensor to inspect the height of the sample and/or the material printed on the sample. In one embodiment, the 3D sensor is a non-contact sensor that can measure the surface height without touching the surface. The 3D sensor may be used in conjunction with the laser scanner to correct any errors in the sample (e.g., in the board production) and/or for fixing errors in the printed material. For example, the 3D sensor may measure the height of the sample and/or the printed material, and in response to the height exceeding a desired height, laser ablation may be applied to reduce the height of the sample and/or the printed material.

In some embodiments of the invention, the system includes a mechanical height sensor that can measure the height of the sample (e.g., the board) at several points by contacting the surface of the sample with probes. The mechanical height sensor as well as the 3D sensor can be used for surface planarization correction and other calibrations for the sample and/or the printed material.

In some embodiments of the invention, the dispensing system is used to dispense a mixture of two materials. Specifically, two materials may be dispensed from two different fluid reservoirs into an injection cell of the dispensing system. After mixing in the injection cell, the two materials start to react, and their pot life is very short. Therefore, the materials are only mixed in the dispensing system just before the mixture is dispensed onto the donor substrate.

In some embodiments of the invention, the injection of the material from the two-component (2 k) dispensing system is performed by mixing the material inside a syringe (i.e., one embodiment of an injection cell) and then, when the coating system of the donor module is placed beneath the dispensing system, the replaceable syringe tip (i.e., also called a replaceable needle) is moved towards into an injection area on the donor substrate while an injection cup is moved away from the injection area. In some embodiments of the invention, the injection cup is used to collect residual material that may block the syringe tip after the materials have reacted.

These and further embodiments of the invention are described in detail below.

BRIEF DESCRIPTION OF THE DRAWINGS

The present invention is illustrated by way of example, and not limitation, in the figures of the accompanying drawings, in which:

FIGS. 11A and 11B illustrate additional details regarding the coating system, in accordance with one embodiment of the invention.

FIGS. 12A and 12B illustrate additional details regarding the coating system, in accordance with one embodiment of the invention.

DETAILED DESCRIPTION OF THE INVENTION

Figure 1:
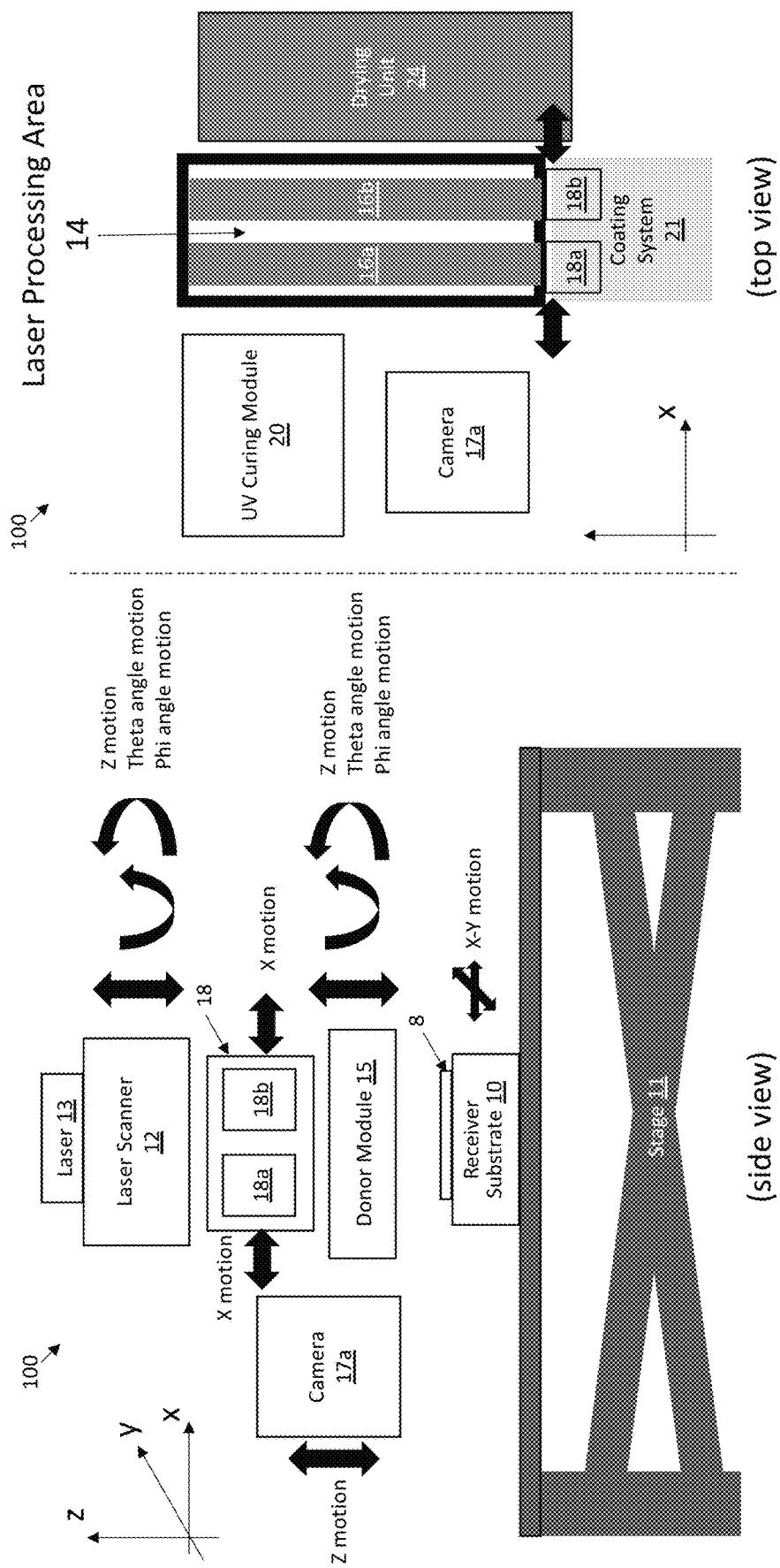
FIG. 1 illustrates, in a conceptual manner, a system with a laterally non-translatable donor module. The system is configured in accordance with embodiments of the present invention which employs a printing at a high resolution at a narrow or contact gap printing system, post-printing processing and/or inspection, and a non-digital curing system to provide high resolution and high-speed printing of viscous materials. By "non-digital" we mean that the curing is performed for all areas of the printed component collectively (at the same time), rather than individually (digitally).
Figure 2:
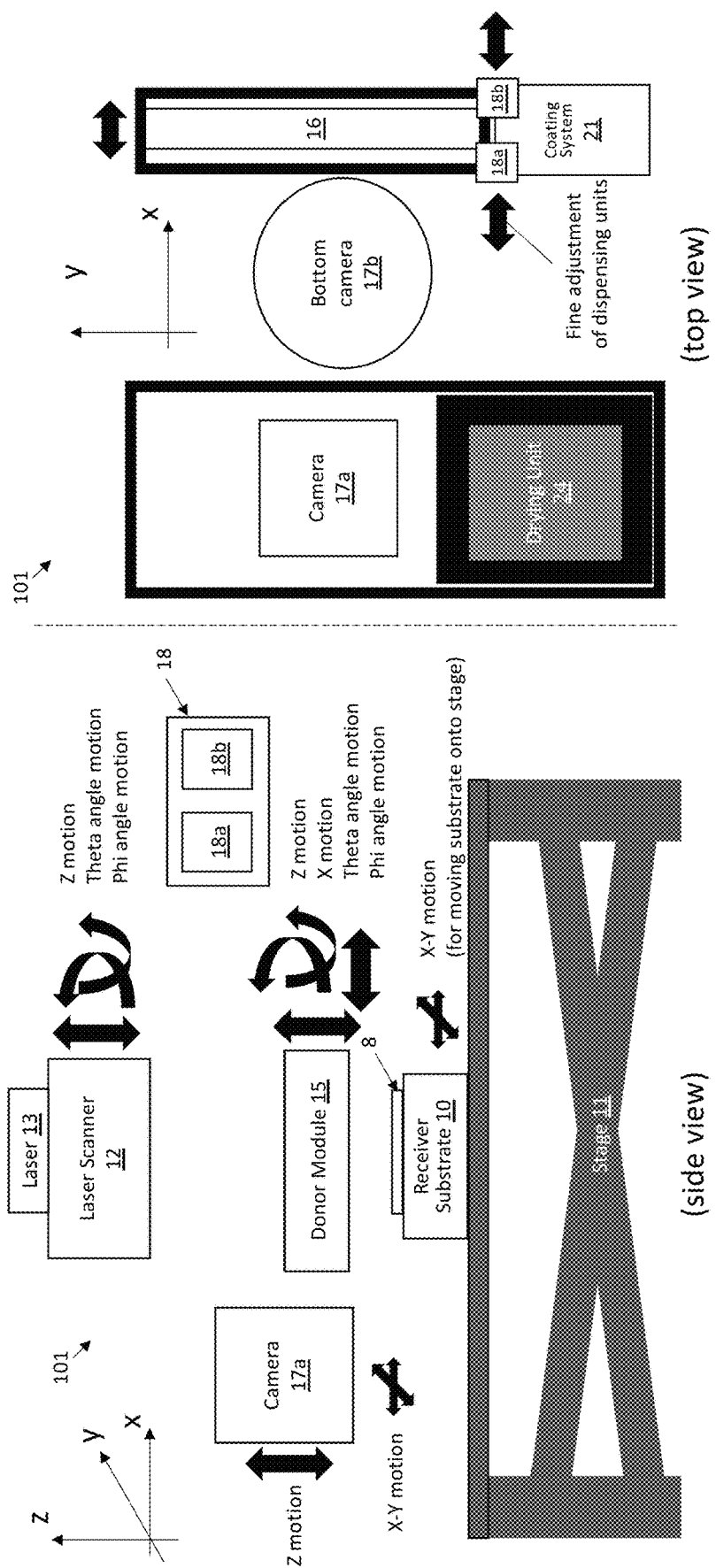
FIG. 2 illustrates, in a conceptual manner, a system with a laterally translatable donor module. The system is configured in accordance with embodiments of the present invention which employs a printing at a high resolution at a narrow or contact gap printing system, post-printing processing and/or inspection, and a non-digital curing system to provide high resolution and high-speed printing of viscous materials.

Before describing the invention in detail, it is helpful to refer to FIG. 1 that illustrates, in a conceptual manner, a system 100 with a laterally non-translatable donor module. The system 100 is configured in accordance with embodiments of the present invention which employs a printing at a high resolution at a narrow or contact gap printing system, post-printing processing and/or inspection, and a non-digital curing system to provide high resolution and high-speed printing of viscous materials. As further described below, the narrow or contact gap printing system performs an initial printing of the viscous material to a sample 8. As part of the preprinting processing and/or inspection, the sample 8 may be observed by one or more imaging arrangements for monitoring and control of the initial and subsequent printing processes.

A transport unit (not depicted) of the system 100 provides several axes of motion for spatially controlling the location of tools utilized during both the calibration processes and post processing operations.

The receiver substrate 10 may be a plate holder that can move in both the X and Y directions on a surface of the stage 11 that is fixed in the Z direction. The surface of the stage 11 is the reference surface for all other surfaces in the system 100, and the receiver substrate 10 can move to all areas on the surface of the stage 11. In that way, the receiver substrate 10 can hold a sample 8 and transport it to any sub-system for both printing and post processing.

The donor substrates 16a, 16b of the donor module 15 each are coated with a material to be printed onto the sample 8 disposed on the receiver substrate 10. In one embodiment, the material may comprise a polymer material or a mixture of the polymer material and a monomer material. In another embodiment, the material may comprise a metal paste, a solder paste or a ceramic paste. In another embodiment, the material may comprise a high viscosity material, a low viscosity material, a wax material, a heat sensitive material (i.e., a material that will cure upon the application of heat), and/or a light sensitive material (i.e., a material that will cure upon the application of light). In another embodiment, the material may be curable by ultraviolet (UV) light and/or by heat.

Each of the donor substrates 16a, 16b may contain a film that is coated with a material. The film may be a transparent film substrate that is translated using rollers. The transparent film substrate may include a metal layer or a metal layer and a dielectric layer, which is distinct from and in addition to the coating applied to the donor substrate by the coating system. That is, the coating applied to the donor substrate by the coating system may be applied on top of the metal layer or the dielectric layer of the transparent film substrate. Additional details of such transparent film substrate may be found in U.S. Pat. No. 10,144,034 to Michael Zenou, incorporated by reference herein.

In system 100, the axis of motion of the donor module 15 is only in the Z direction. However, since the height of the legs on which the donor module 15 is mounted can be independently adjusted via motors, the surface of each of the donor substrates 16a, 16b can additionally be adjusted in two angles (theta and phi on the X and Y axis). Using those motors, the surface of the donor substrates 16a, 16b can be adjusted to be parallel to the surface of the receiver substrate 10 in a repeatable and accurate manner.

An additional "surface" that may be aligned to the surface of the receiver substrate 10 is the focal plane of the laser 13 controlled by laser scanner 12. The axis of motion of the laser 13 is also only in the Z direction. However, similar to the donor module 15, the laser 13 is mounted on height-adjustable legs (controlled with motors), allowing the focal plane of the laser 13 to be adjusted parallel to the surface of the receiver substrate 10.

In system 100, the donor module 15 additionally includes a coating system 21 and a dispensing system 18, including two dispensing units 18a, 18b. For each of the donor substrates 16a, 16b, material is dispensed on the donor substrate 16a, 16b, and the donor substrate 16a, 16b is translated through a gap formed between two rollers that applies a pressure on the material and generates a uniform layer of the material at the desired thickness on the donor substrate 16a, 16b.

For each of the donor substrates 16a, 16b, a material is dispensed on each of the donor substrates 16a, 16b by a syringe that contains the material or by any other dispensing apparatus. To obtain a better uniformity of the material on each of the donor substrates 16a, 16b, the material is also dispensed across the donor substrates 16a, 16b in a line shape using a raster motion rather than in a dot shape. The system 100 illustrated in FIG. 1 has two donor substrates 16a, 16b and therefore can be used to print two different materials onto the sample 8. Each dispensing unit 18a, 18b may be equipped with its own motor to laterally translate the dispensing unit 18a, 18b in a back and forth manner in the lateral (X) direction.

The camera 17a is used to inspect the surface of the sample 8 before and/or after the printing of the material onto the sample 8. In embodiments with a receiver substrate 10 that is translatable in the X and Y directions, the camera 17a may be fixed in the X and Y dimensions, but is moveable in the Z direction to adjust its focal plane to coincide with the sample surface. The camera 17a can also contain a zoom lens to increase the inspection resolution.

Two post processing units are optionally placed inside the system 100: UV curing module 20 and drying unit 24. The UV curing module 20 is used for curing UV sensitive materials after those materials have been deposited on the sample 8. The drying unit 24 is used for curing heat sensitive materials after those materials have been deposited on the sample 8.

The UV curing module 20 may contain a UV light source (not depicted) to emit UV light at the desired wavelength and a gas inlet (not depicted) to inject a gas to improve the curing speed. In scenarios where oxygen inhibits the UV curing of the deposited material, the gas can be an inert gas for generating a low oxygen environment just above the sample 8. Additional details of such UV curing module 20 are provided in US 2020/0180225 to Zenou et al., incorporated by reference herein.

The area 14 between the two donor substrates 16a, 16b can be utilized for laser post processing operations, including sintering and/or ablation. A metallic material that is deposited by LAD on the sample 8 can be sintered to increase the conductance of the metallic material (e.g., create a better conduction line) using the same laser 13 that was used to print the metallic material from the donor substrate 16a, 16b onto the sample 8. The metallic material may come in a paste-like substance that is formed by a mixture of small metal particles and solvent. After the metallic material has been deposited on the sample 8, the solvent may be removed by applying heat from the drying unit 24 onto the deposited material, resulting in small clumps of small metal particles. Therefore, the conductivity of the metal particles, at least initially, is not the same as the conductivity of a uniformly solid form of the metal, because the electrons of the metal have a long path to travel from one end of the deposited material to the other. For that reason, the laser 13 is used to sinter and melt the particles together so as to create a better interaction between neighboring metal particles and increase the overall conductivity of the printed lines.

In some embodiments, ablation of the deposited material is performed in order to remove portions of unwanted material (e.g., to increase the smoothness of the sample surface). Ablation may be used to repair a mistake on the deposited material that occurred as a result of a printing mistake or to repair a mistake on the sample 8 that was introduced in a previous stage of the sample formation process. Ablation can also be used to enhance the resolution of certain portions of the sample 8 for which enhanced resolution would be beneficial.

The donor module 15 of system 101 is laterally translatable which provides several advantages as compared to the donor module 15 of system 100 that is not laterally translatable. The main advantage of system 101 is the ability to print, inspect and post-process the sample 8 with the sample 8 fixed in place, which can increase the resolution and the repeatability of the different processes (e.g., the printing, inspection and post-processing processes). To clarify, in both systems 100 and 101, the donor module 15 may be translatable in the vertical (Z) direction. For example, if the sample 8 (e.g., board) contains areas with different heights, the donor module 15 may be adjusted to one height in one place and to another height in another place. However, the donor module 15 of system 101 is also translatable in the lateral (X) direction, which is perpendicular to the vertical (Z) direction.

Another important advantage of system 101 is the ability to continuously inspect the coating quality on the donor substrate 16 during the printing. The quality of the coating on the donor substrate 16 can be inspected when the donor module 15 is translated between the printing area (i.e., above the receiver substrate 10) and the coating area (i.e., under the dispensing system 18). After a top facing surface of the donor substrate 16 has been coated by the dispensing system 18 (e.g., using syringes), the donor substrate 16 makes an approximately 180° turn about a roller, causing the coated surface of the donor substrate 16 (upstream of the roller) to face downwards (downstream of the roller). Subsequently, when the donor module 15 is translated from the coating area to the printing area, the bottom camera 17b can be used to inspect the coating to determine a quality of the coating on the donor substrate 16. Such an inspection process enables a better print quality control.

In system 101, the dispensing system 18 is not fixedly attached to the coating system 21. In such an embodiment, the donor module 15 (with the coating system 21) is placed in the printing area during the printing operation. When the coating on the donor substrate 16 has been depleted, the donor module 15 can be translated to the coating area under the dispensing system 18 (disposed adjacent to the printing area), where material is dispensed onto the donor substrate 16, and then the donor substrate 16 is passed through the gap of the coating system 21 (the motion of the donor substrate 16 through the gap provided by a motor) to spread out the dispensed material into a new uniform coating on the donor substrate 16. After the donor substrate 16 has been coated, it is inspected immediately by the bottom camera 17b and sent to the printing area for further printing. In the event that inspection by the bottom camera 17b reveals that the coating quality is not satisfactory, the donor substrate 16 may be sent back to the coating area and recoated. The placement of the dispensing system 18 off to the side of the printing area allows the dispensing system 18 to occupy more room without interfering with the printing process. In such case, the dispensing system 18 may include more syringes (e.g., 5 syringes), allowing the dispensing of many different materials.

An important feature of system 101 is that other sub-systems can be moved to the printing area using the same transport unit (e.g., including rails) that is used to laterally translate the donor module 15. Therefore, drying, inspection or UV curing of the deposited material can be performed at the same location as the donor module 15 was located during the printing operation. To provide an additional degree of freedom in movement (e.g., for each of the subsystems to move all over the printing area), another axis can be added to the transport unit, in the vertical (Y) direction.

The camera 17a may be moveable about three axes, the Z axis for focusing the camera 17a on the sample surface and the X-Y axes for positioning the camera 17a with respect to different locations on the sample surface. The drying unit 24 and the UV curing module 20 can also be equipped to move about three axes, but the position axes (X and Y) are the most important for those sub-systems.

Figure 3A:
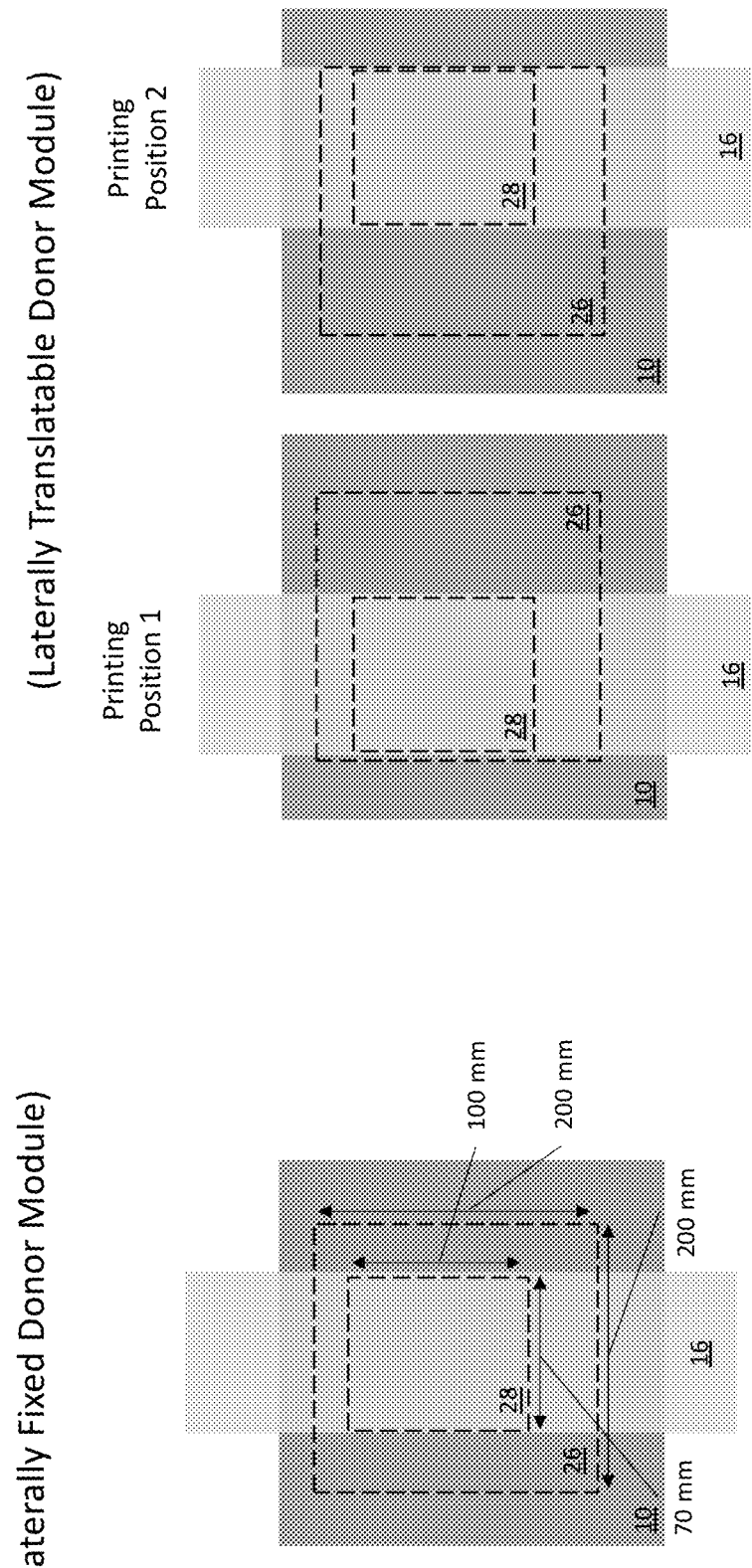
FIGS. 3A and 3B illustrate the advantages of the laterally translatable donor module compared to the laterally non-translatable donor module: a larger printing area without moving the receiver substrate (FIG. 3A) and the ability to print and post process the same areas of the sample without moving the receiver substrate (FIG. 3B).
Figure 3B:
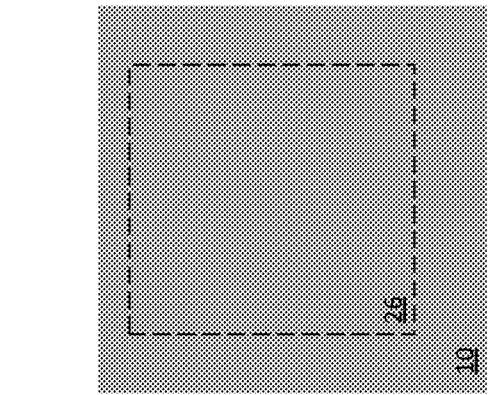
Figure 3B:
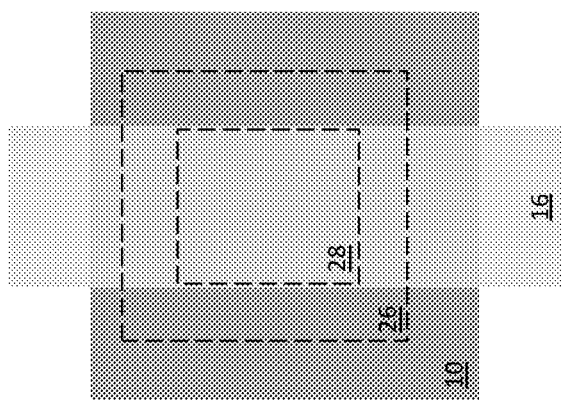

FIGS. 3A-3B show some of the advantages of system 101 with the laterally translatable donor module 15. In the simplified schematic of FIGS. 3A-3B, only the donor substrate 16 of the donor module 15 is shown. FIG. 3A shows the receiver substrate 10 located in the printing area 28. The scanning area 26 (e.g., measuring 200×200 mm) is an area within which the laser scanner 12 is equipped to scan a laser beam. The printing area 28 (e.g., measuring 70×100 mm) of the donor substrate 16 is smaller than the scanning area 26 and therefore in the case of a laterally non-translatable donor module 15 (left portion of FIG. 3A), the printing is limited to the fixed position of the printing area 28. In contrast, in a laterally translatable donor module 15 (right portion of FIG. 3B), the printing area 28 can be translated across the scanning area 26 (see, e.g., printing positions 1 and 2), allowing the printing to occur over a larger portion of the laser scanning area 26. The main advantage of using a larger scanning area 26 for printing is that the area of the sample 8 that can be printed without changing its position is also larger, a fact that increases both the printing speed and the resolution of the printing. It also enables a better material usage during the print operation.

FIG. 3B (left) shows the donor substrate 16 of a laterally fixed donor module 15 being located in the middle of the scanning area 26 after the printing of a layer has been completed. During post processing, the donor module 15 serves as an obstacle to the laser scanner 12, UV curing module 20, camera 17a, and other post processing units, as the donor module 15 blocks access to a region of the sample 8 directly under the donor module 15. If such blocked region needs to be post processed, the receiver substrate 10 must be moved to translate regions of the sample 8 outside of the "shadow" of the donor module 15. On the other hand, in the system 101 with a laterally translatable donor module 15, the donor module 15 can be translated away from the scanning area 26 (see right portion of FIG. 3B) and post processing can be performed over the entirety of the scanning area 26 without moving the receiver stage 10. The alignment between the print and the post processing operations (e.g., sintering or ablation) will therefore be at the positional accuracy of the laser scanner 12.

In both the systems 100 and 101, the donor substrates 16, 16a, 16b of the donor modules 15 are coated by the coating system 21, in which material dispensed on the donor substrates is pressed through a gap between two rollers. Additional details regarding the coating system 21 may be found in US 2021/0331196 to Zenou et al., incorporated by reference herein. Occasionally, an excess amount of material is dispensed on the donor substrate and translation of the donor substrate through the gap causes the excess material to drip from the gap and contaminate portions of the donor module 15 and/or coating system 21. The donor substrates 16, 16a, 16b also must be replaced occasionally, and maintenance should be performed on the donor module 15 and/or coating system 21.

Figure 4:
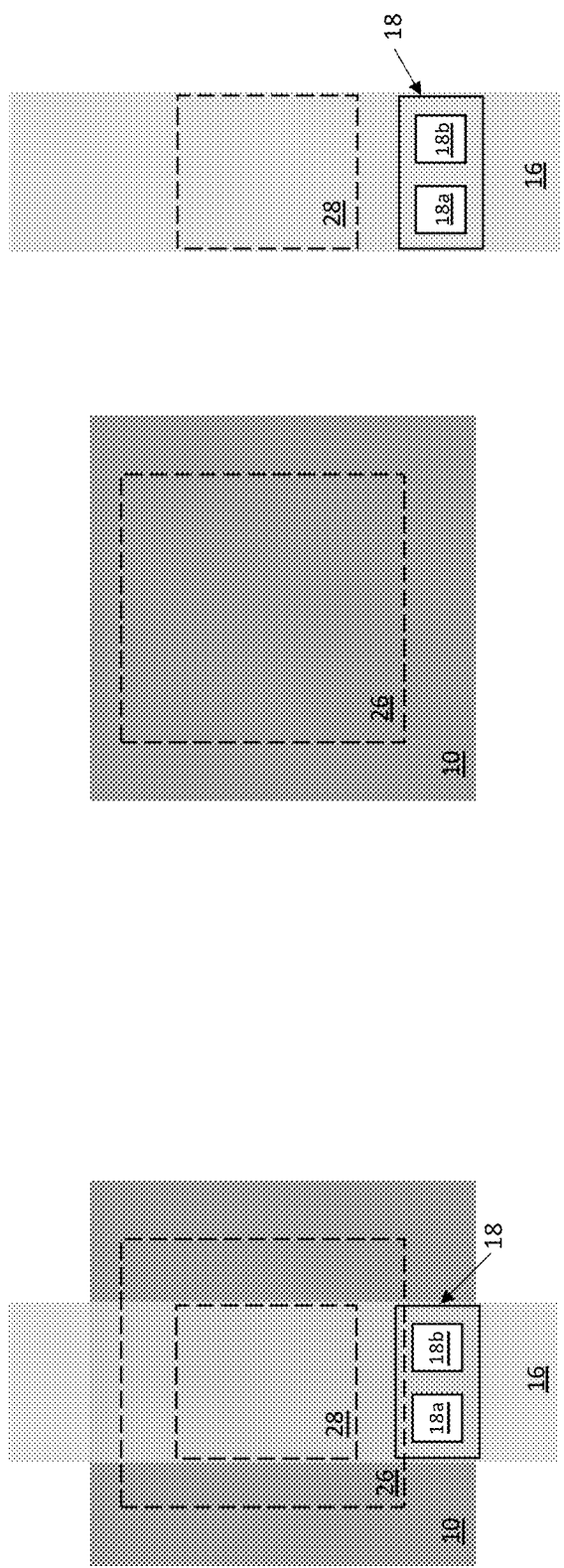
FIG. 4 illustrates the location of the dispensing system in both the system with the laterally non-translatable donor module and the system with the laterally translatable donor module. In the former system, the donor module is positioned above the receiver substrate in the printing area and therefore the dispenser must also be positioned in the printing area in order to supply material to the donor substrate. However, in the latter system, the dispensing system is positioned adjacent to the printing area, enabling a simpler maintenance of the dispensing system.

In the case of the system 100 with the laterally non-translatable donor module 15, the donor module 15 and the dispensing system 18 are located over the receiver substrate 10 (see FIG. 4, left half). Access to the donor module 15 and/or coating system 21 is restricted by the dispensing system 18, so maintenance on the donor module 15 and/or coating system 21 typically requires removing the donor module 15 and/or coating system 21 from the system 100. However, in the case of the system 101 with the laterally translatable donor module 15 (see FIG. 4, right half), the dispensing system 18 is located one side of the system 101, allowing for a simpler maintenance of the donor module 15 and/or coating system 21 as the donor module 15 and/or coating system 21 can be serviced in situ.

In system 101, it is also possible for the dispensing system 18 to dispense additional materials or to include a complex syringe system. For example, a complex syringe system may be used to dispense two-component (2 k) materials like epoxy that must be mixed in the syringe before being dispensed onto the donor substrate 16. In such complex syringe systems, the syringe may need to be replaced occasionally, and such replacement of the syringe is more easily performed in system 101. In system 101, the dispensing system 18 may include a purging (or injection) cup 48 (see FIGS. 10A, 10B) to collect residual material from the complex syringe system, in order to decrease the number of times the syringe needs to be replaced.

To emphasize, the most important feature of system 101 with the laterally translatable donor module 15 is the ability to post process the sample 8 just after the printing of material onto the sample 8, and in between two consecutive print sessions without moving the sample 8. That feature enables a very high precision of both the sintering and the ablation of the sample 8 and/or the material deposited onto the sample 8. The fact that the post processing can be performed by the laser scanner 12 reduces the alignment error to a minimum that is dictated only by the precision of the laser scanner 12. Since the scanner precision is in the range of 3-5 microns and can be even better (depending on the scanner), the post processing can also be performed with that precision.

Figure 5:
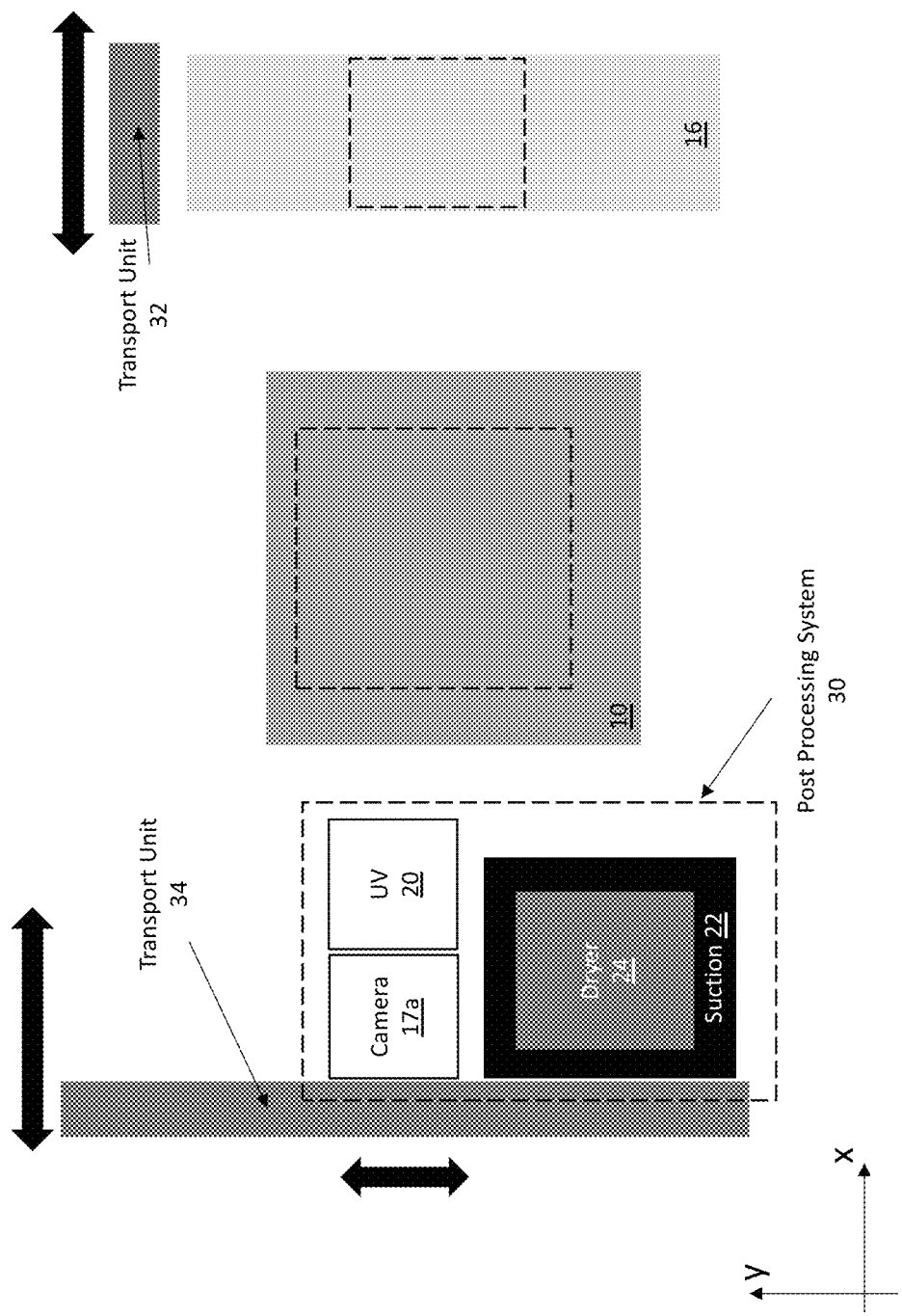
FIG. 5 illustrates the system with the laterally translatable donor module. The transport unit is equipped with an X-axis of movement to additionally move the donor substrate back and forth between the printing area and the coating area, and further enables several post processing operations to be performed between the printing sessions. The additional X-axis of movement also provides the ability to inspect the products of the printing (e.g., using a camera, 3D sensor, mechanical height sensor, etc.).

FIG. 5 illustrates how the post processing system 30 (e.g., including the drying unit 24, suction unit 22, UV curing module 20, camera 17a, and other inspection tools) is mounted on the transport unit 34 that can move in both the X and the Y directions. Therefore, each of the units of the post processing system 30 can reach any region on the sample 8 to dry, cure and/or inspect that region. In one embodiment, each of the units of the post processing system 30 is mounted on its own transport unit, allowing each of the units to independently move to post-process any region on the sample 8. As shown in FIG. 5, the donor substrate 16 may be laterally translated away by the transport unit 32 from the receiver substrate 10 prior to the post processing.

Figure 6A:
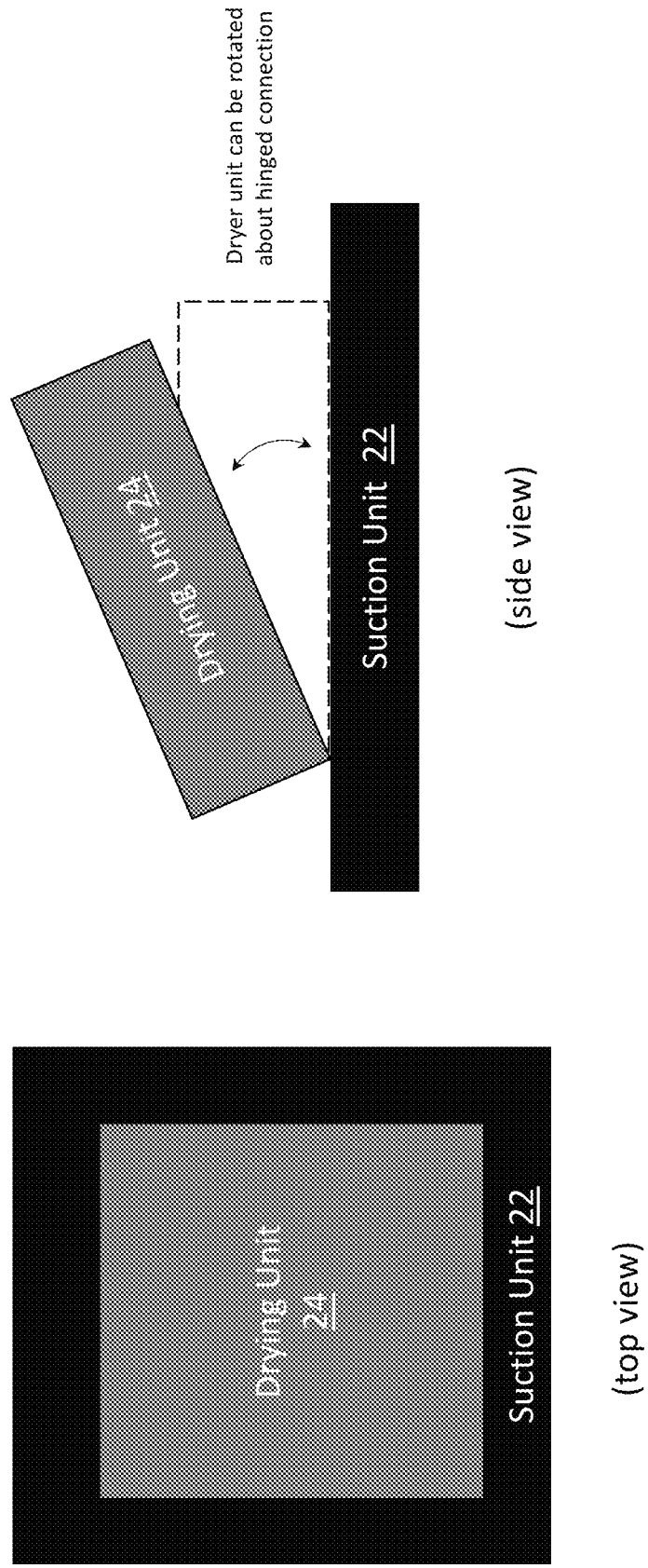
FIGS. 6A and 6B illustrate a drying and suction assembly that includes a drying unit that is surrounded by a suction unit, in accordance with one embodiment of the invention. The drying unit can be turned off and "flipped up" to allow laser ablation to be performed through the opening (i.e., window) in the suction unit while the suction unit is operating.
Figure 6B:
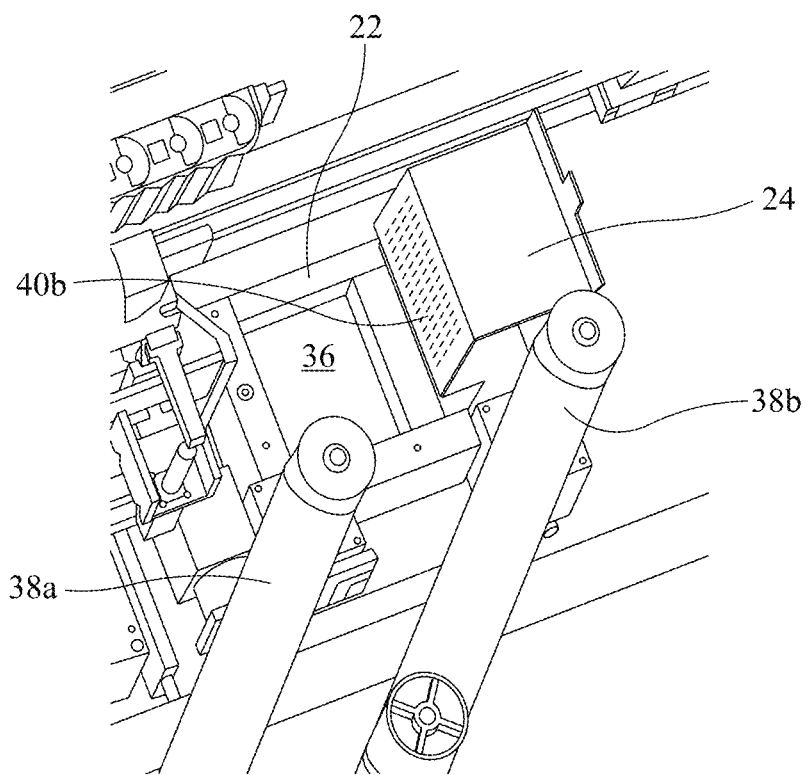
Figure 6B:
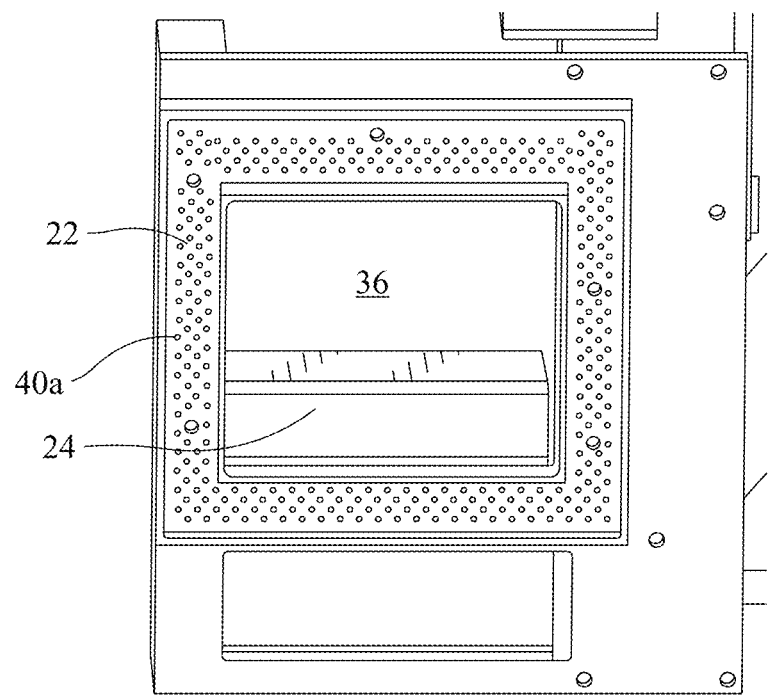

FIGS. 6A and 6B illustrate an embodiment of the drying and suction assembly that can be used in both system 100 and system 101. FIG. 6A schematically depicts a top view of the assembly in which the drying unit 24 is positioned inside a central cavity 36 of the suction unit 22. During an ablation step, the drying unit 24 may be turned off and rotated about a hinge (e.g., flipped up), so as to expose the central cavity 36 (e.g., window) of the suction unit 22 through which a laser beam may be scanned to perform ablation at the same time as the suction operation.

FIG. 6B shows a detailed view of the drying and suction assembly. Drying may be performed by delivering a heated gas (e.g., hot air) onto the surface of the sample 8 from the drying unit 24. The heated gas may be distributed uniformly over the sample 8 via holes 40b disposed on the bottom surface of the drying unit 24. The heated gas may be evacuated from the sample 8 via the holes 40a disposed on the bottom surface of the suction unit 22 and/or other holes 40b that are disposed on the bottom surface of the drying unit 24. In some embodiments, the drying and suction assembly is positioned via a transport unit that enables the post-processing unit to be transported to and from an area of the sample 8 that requires suction or heating. Also shown in FIG. 6B are gas conduits to supply the vacuum for the drying and suction assembly. Conduit 38a may supply the vacuum to suction unit 22 and conduit 38b may supply the vacuum to drying unit 24.

Figure 7:
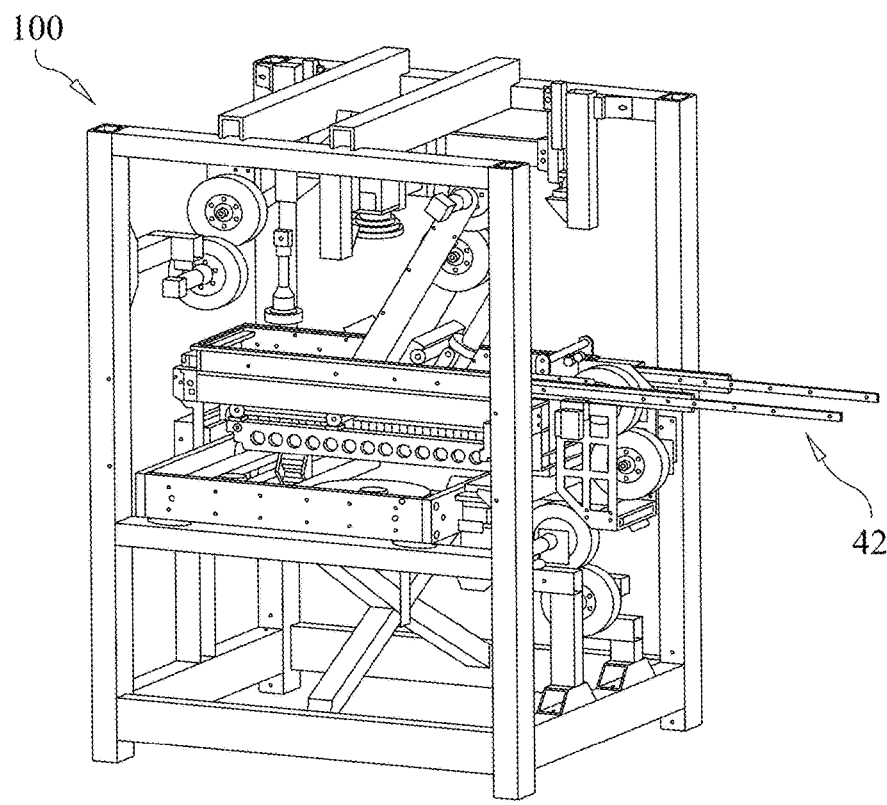
FIG. 7 depicts a perspective view of the two systems, system with laterally non-translatable donor module (left) and system with laterally translatable donor module (right), in accordance with embodiments of the invention. The system with the laterally non-translatable donor module may include a drawer mechanism for easy maintenance of the donor module. The system with the laterally translatable donor module may include a post processing system (with one or more post processing units) that can be translated over the printing area.
Figure 7:
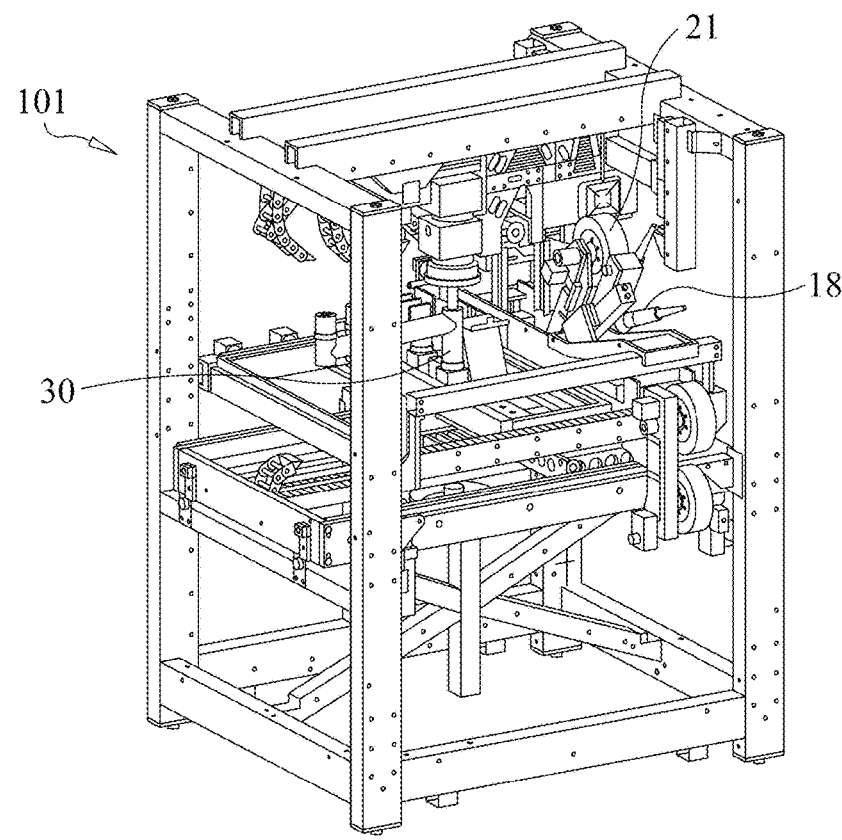

FIG. 7 shows a detailed view of system 100 with the laterally fixed donor module (top-left portion of FIG. 7) and system 101 with the laterally translatable donor module (bottom-right portion of FIG. 7). To clarify, while the donor module 15 in system 100 may be fixed in the lateral (X) direction during the printing and coating operations, this donor module 15 may be translated in the lateral (X) direction during a maintenance phase. More specifically, such donor module 15 may be mounted on a drawer mechanism 42 that allows the donor module 15 to be translated in the lateral (X) direction along the rails of the drawer mechanism 42 until the donor module 15 reaches a position that it can be lifted from the drawer and removed for maintenance. To clarify, the drawer of the drawer mechanism 42 may include a bottom supporting surface that supports a bottom rim of the donor module 15, but at the same time includes an opening in the bottom supporting surface. This opening exposes the donor substrate 16*a*, 16*b* to the top surface of the sample 8, allowing material to be ejected from the donor substrate 16*a*, 16*b* onto the sample 8 during a printing operation.

In the system 101 with the laterally translatable donor module (bottom-right portion of FIG. 7), the dispensing system 18 is positioned on one side of the system 101. After a printing operation, a portion of the coating system 21 is positioned under the dispensing system 18 for coating the donor substrate, while the post processing system 30 is positioned inside the printing area (i.e., above the receiver substrate 10) for inspecting the sample 8 and/or material deposited on the sample 8.

Figure 8A:
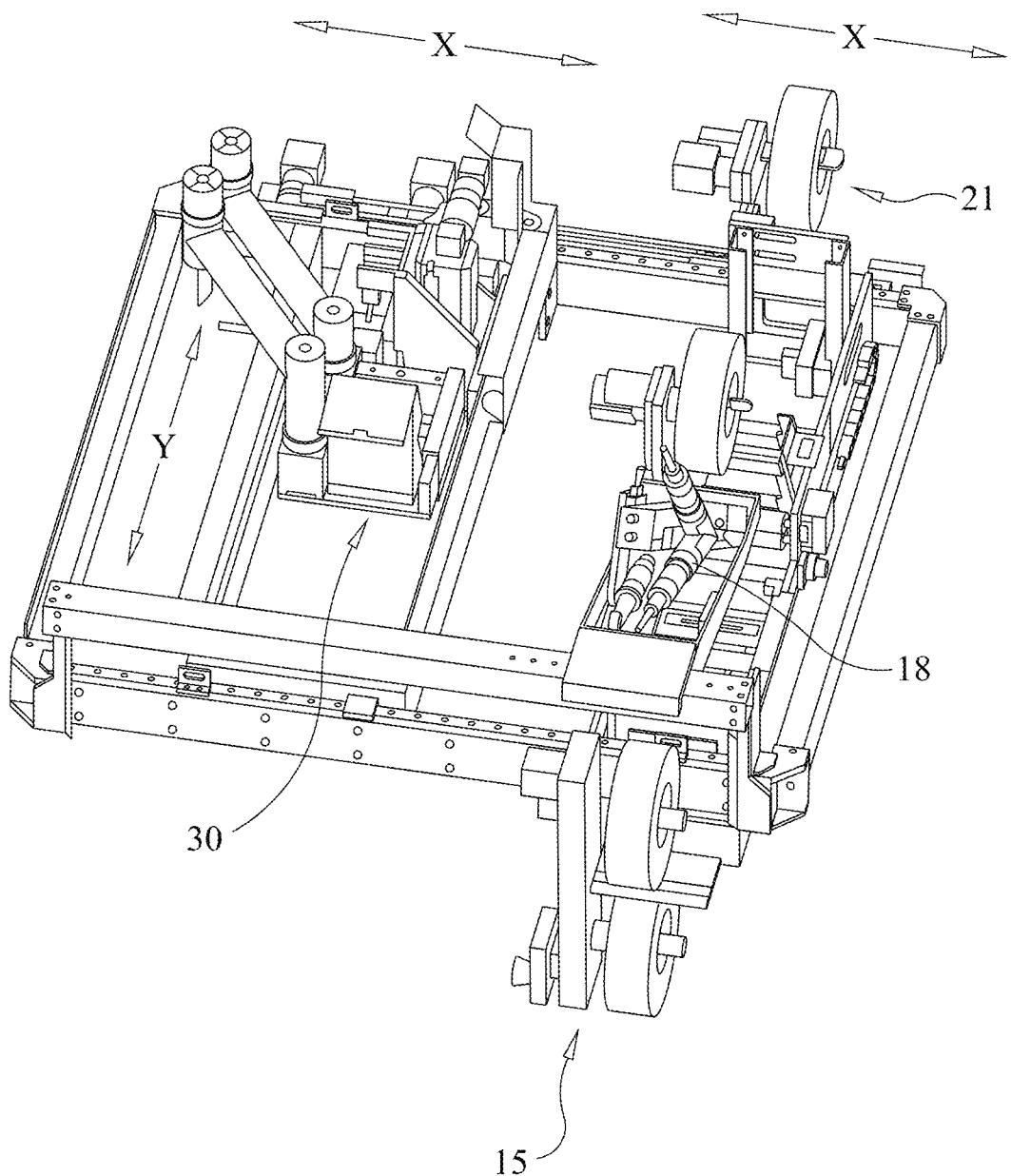
FIGS. 8A and 8B illustrate aspects of moving certain components of the system with the laterally translatable donor module, in accordance with one embodiment of the invention. The donor module (along with the coating system) can be translated from the printing area to the coating area, enabling the post processing system to enter the printing area (FIG. 8A). Additionally, the donor module (along with the coating system) can be translated to the printing area, while the location of the dispensing system remains unchanged (FIG. 8B). The movement axes of the transport unit also illustrated.
Figure 8B:
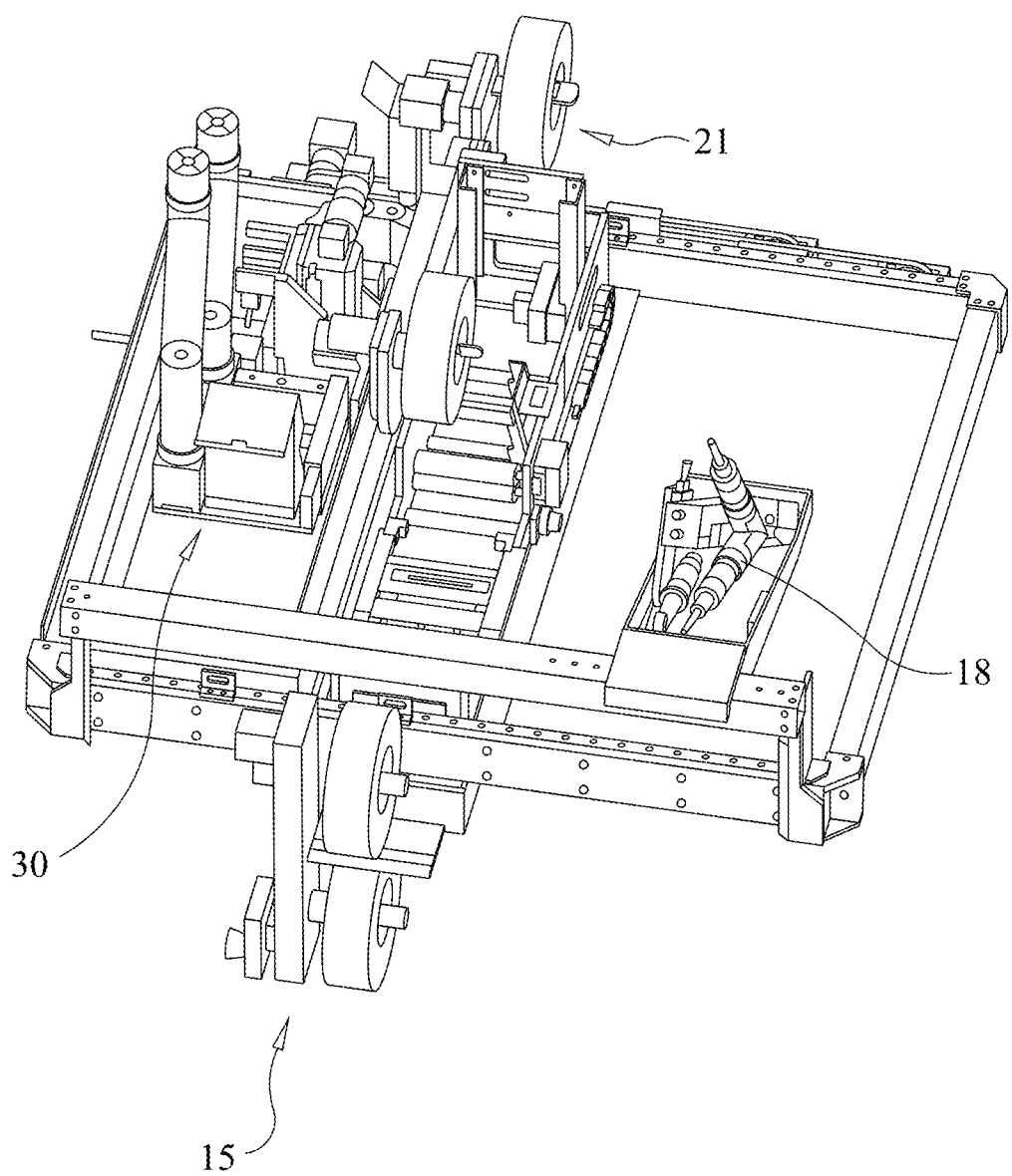

FIGS. 8A-8B show a detailed view of the donor module 15, the coating system 21 and the post processing system 30. FIGS. 8A and 8B show how the donor module 15 and the coating system 21 can move between the coating position under the dispensing system 18 (FIG. 8A) and the printing position (FIG. 8B). Additional details regarding the coating system 21 may be found in US 2021/0331196 to Zenou et al. For simplicity in illustration, the donor substrate of the donor module 15 is not depicted in FIGS. 8A-8B. Additional details regarding the coating of the donor substrate may also be found in US 2021/0331196 (in which the donor substrate is referred to as film 112). FIG. 8A also shows that when the donor module 15 is positioned under the dispensing system 18, the post processing system 30 can move (about the X and Y axes) to an inspection, curing and/or ablation position over the sample 8 (not depicted).

Figure 8C:
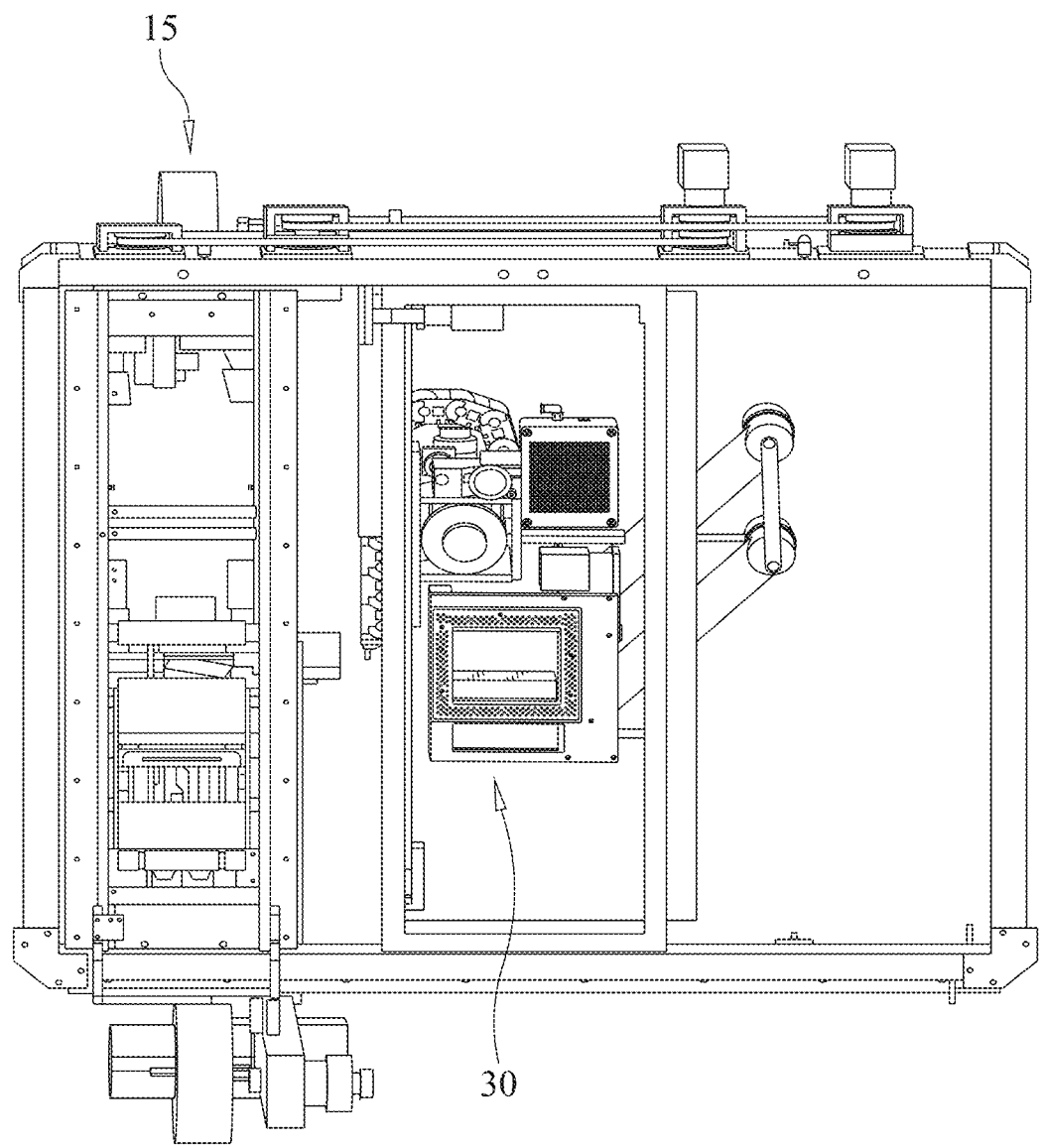
FIG. 8C illustrates a top view of the donor module and the post processing system, in accordance with one embodiment of the invention.

FIG. 8C depicts a bottom view of the donor module 15 and the post processing system 30. In FIG. 8C, the donor module 15 is located in the coating position and the post processing system 30 is located in the inspection, curing and/or ablation position.

Figure 8D:
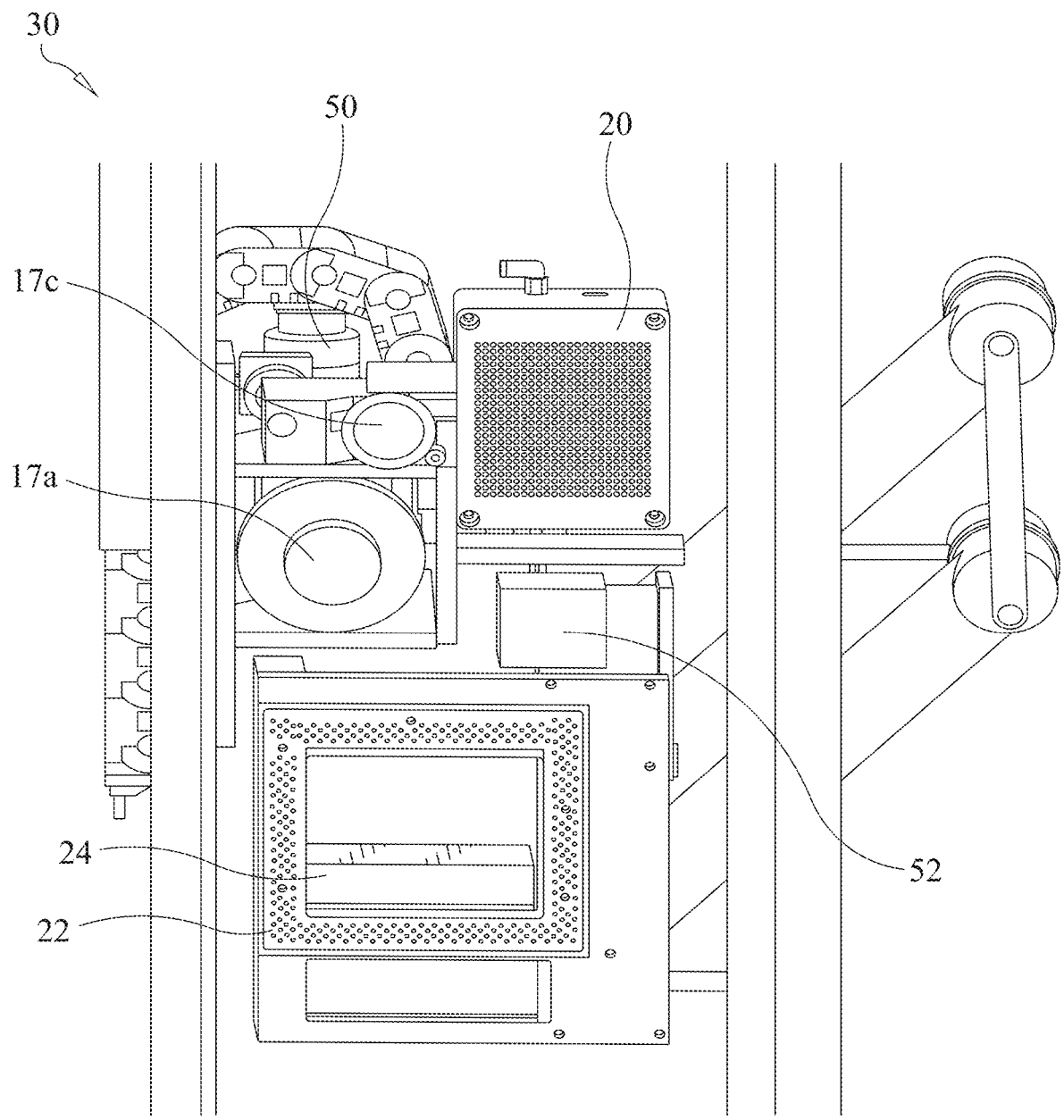
FIG. 8D depicts the post processing system in greater detail, in accordance with one embodiment of the invention.

FIG. 8D depicts a bottom view of the post processing system 30 in greater detail. The post processing system 30 may include the previously described drying and suction assembly (comprising drying unit 24 and suction unit 22). The post processing system 30 may also include the previously described UV curing module 20. The post processing system 30 may also include cameras 17*a*, 17*c* that can inspect the sample 8 before and after the print in one or more magnification settings. In some embodiments of the invention, one camera with several selectable magnifications may be utilized, or several cameras, each with a corresponding fixed magnification, may be utilized for the convenience of the user. Such cameras may be used (in conjunction with the transport unit) to position the donor substrate 15 in the X and Y dimensions.

The post processing system 30 may also include a 3-dimensional (3D) sensor 52 to inspect the height of the sample and/or the material printed on the sample. In one embodiment, the 3D sensor 52 is a non-contact laser sensor that can measure the surface height without touching the surface. The 3D sensor 52 may be used in conjunction with the laser scanner 12 to correct any errors in the sample 8 and/or for fixing errors in the printed material. For example, the 3D sensor 52 may measure the height of the sample 8 and/or the printed material, and in response to the height exceeding a desired height, laser ablation may be applied to reduce the height of the sample 8 and/or the printed material.

The post processing system 30 may also include probes 50 (also called a mechanical height sensor) that can measure the height of the sample 8 at several points by contacting the surface of the sample 8 with the probes 50. The probes 50 as well as the 3D sensor 52 can be used for surface planarization correction and other calibrations for the sample 8 and/or the printed material.

Figure 8E:
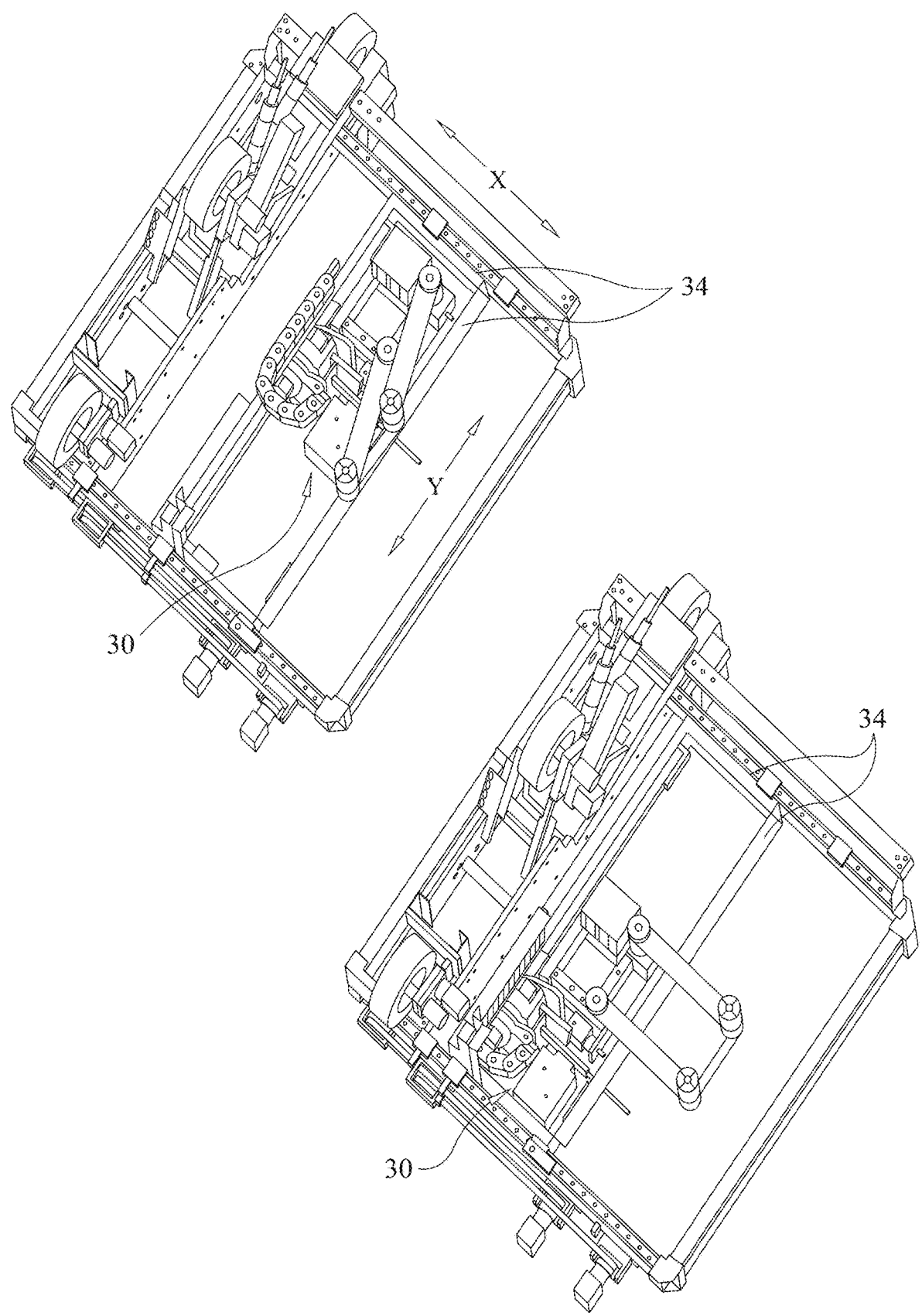
FIG. 8E illustrates the axes of motion of the post processing system, in accordance with one embodiment of the invention.

FIG. 8E illustrates the axes of motion of the post processing system 30. As shown in FIG. 8E, the post processing system 30 may be mounted on rails of the transport unit 34 that enable the post processing system 30 to be translated laterally in the X and Y directions.

Figure 9A:
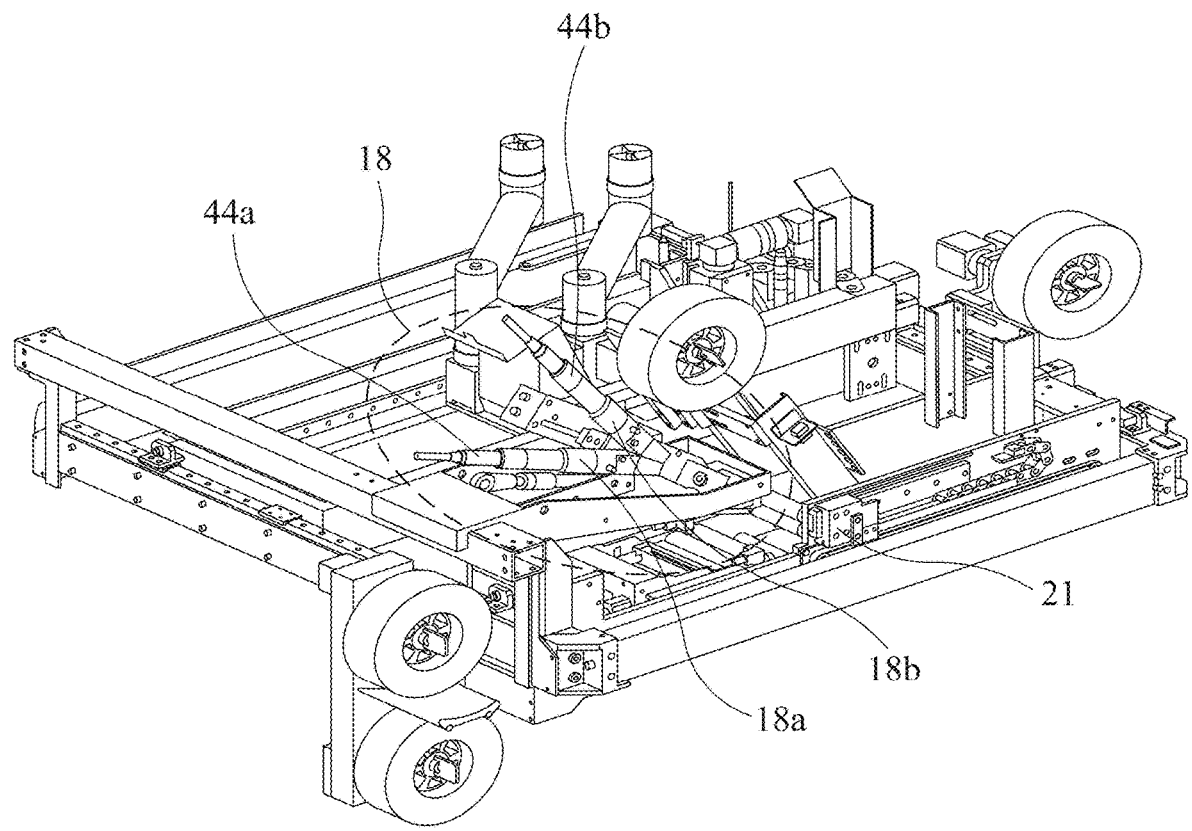
FIG. 9A illustrates a top-front perspective view of a portion of the system, in accordance with one embodiment of the invention.
Figure 9B:
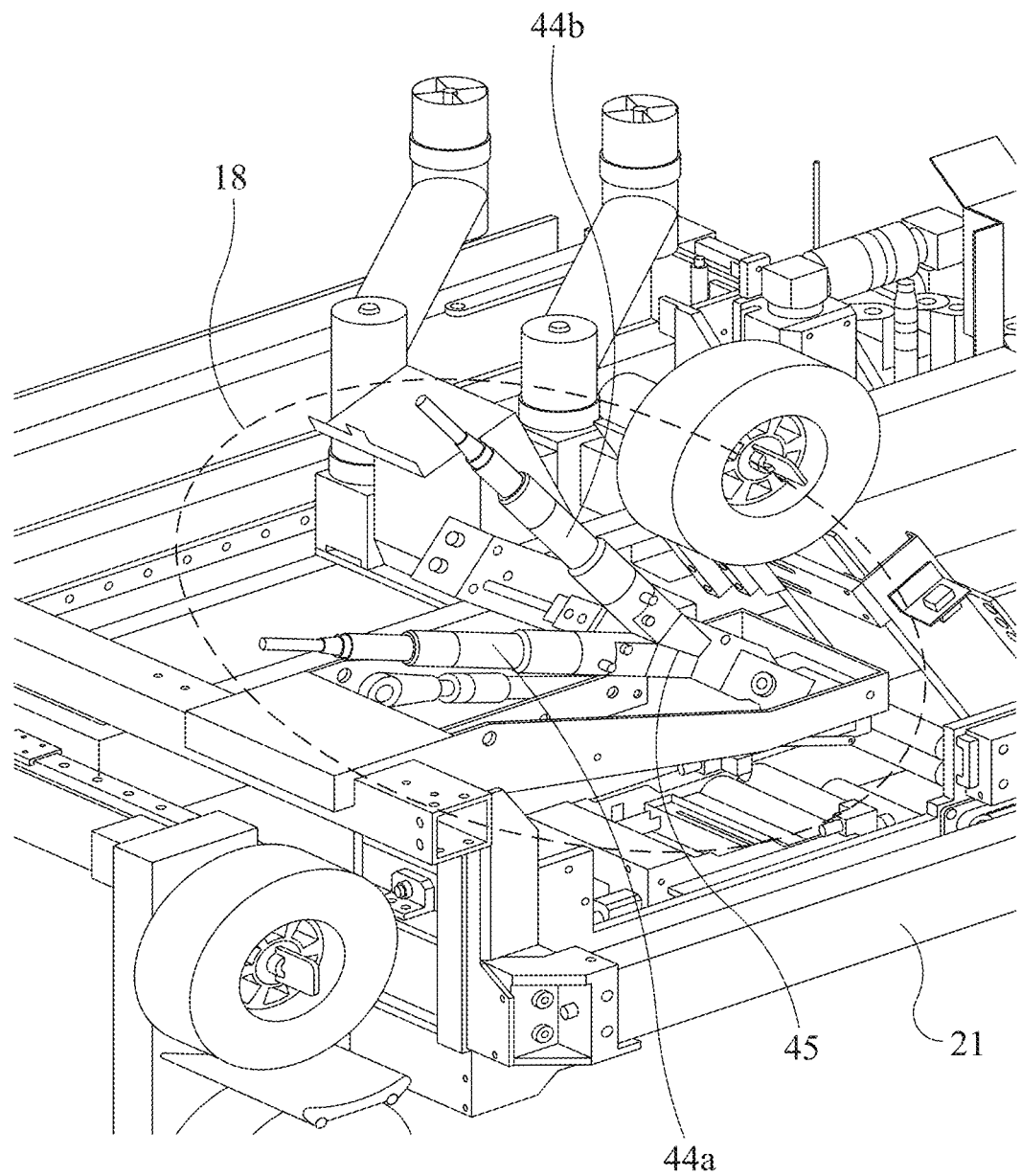
FIG. 9B illustrates a zoomed-in view of the dispensing system of the system shown in FIG. 9A for dispensing two component materials (2 k materials), in accordance with one embodiment of the invention.

FIGS. 9A and 9B illustrate the coating and dispensing system for two-component (2 k) materials. FIG. 9A shows a portion of the coating system 21 disposed under the dispensing system 18, and FIG. 9B depicts a magnified version of the dispensing system 18 disposed above the portion of the coating system 21. Specifically, two materials may be dispensed from two different fluid reservoirs 44*a*, 44*b* (corresponding to two dispensing units 18*a*, 18*b*) into an injection cell 45 of the dispensing system 18. After mixing in the injection cell 45, the two materials start to react, and their pot life is very short. Therefore, the materials are only mixed in the dispensing system 18 just before the mixture is dispensed onto the donor substrate 16.

Figure 10A:
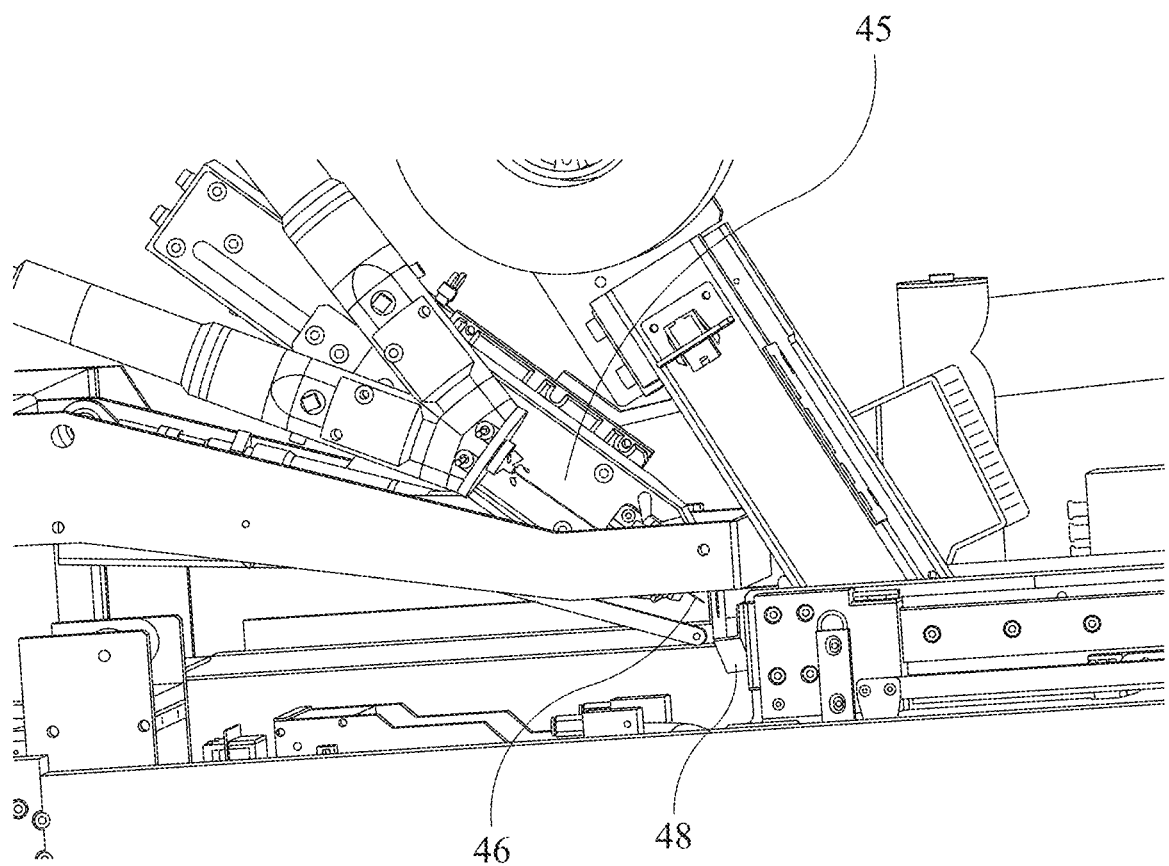
FIGS. 10A and 10B illustrate aspects of purging material from the system while using two component materials (2 k materials) in the system, in accordance with one embodiment of the invention.
Figure 10B:
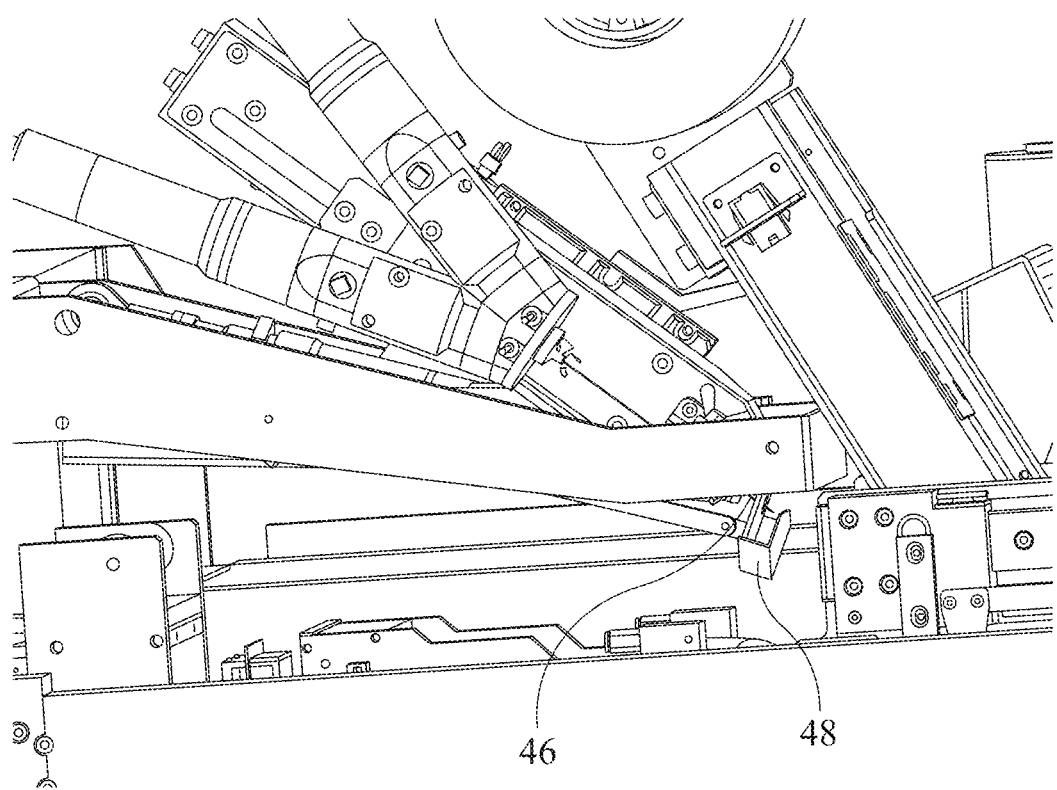

FIGS. 10A and 10B show a cleaning system for the dispensing system 18. The injection of the materials from the two-component dispensing system 18 is performed by mixing the materials inside a syringe (i.e., one embodiment of an injection cell 45) and then, when the coating system 21 of the donor module 15 is placed beneath the dispensing system 18, the replaceable syringe tip 46 (i.e., also called a replaceable needle) is moved towards an injection area while an injection cup 48 is moved away from the injection area. In some embodiments of the invention, the injection cup 48 is used to collect residual material that blocks the syringe tip 46 after the materials have reacted. As shown in FIG. 10B, the syringe tip 46 may protrude into the injection cup 48 through a tiny hole of the injection cup 48.

FIGS. 11A and 11B further illustrate the creation of a uniform layer 62 of material on a donor substrate 16. First, the material 66 may be dispensed on the donor substrate 16 by a syringe 64 (FIG. 11A) or more generally, a dispensing system. The donor substrate 16 may be translated by a pair of rollers 54*a*, 54*b* that are rotated about respective axes by a motor 56. The translation of the donor substrate 16 may cause the dispensed material 66 to pass through a gap 60, thereby forming the uniform layer 62 of material (FIG. 11B). The gap 60 may be created by bringing a pair of rollers 58*a*, 58*b* close together using an appropriate control unit (e.g., a stepper motor or piezo transducer). The syringe 64 (or more generally, the dispensing system) may be located inside a closed cell 68 with a controlled environment so as to prolong a pot life of the material 66.

FIGS. 12A and 12B are identical to FIGS. 11A and 11B, except that a knife 70 (or other leveling device) and the donor substrate 16 is used to form the gap 60 instead of the pair of rollers 58*a*, 58*b*.

Thus, systems for printing viscous materials using laser assisted deposition have been described. Many other embodiments will be apparent to those of skill in the art upon reviewing the above description. The scope of the invention should, therefore, be determined with reference to the appended claims, along with the full scope of equivalents to which such claims are entitled.

LIST OF REFERENCE NUMERALS

8 Sample
10 Receiver Substrate
11 Stage
12 Laser Scanner
13 Laser
14 Laser Processing Area
15 Donor Module
16, 16a, 16b Donor Substrates
17a, 17b, 17c Cameras
18 Dispensing System
18a, 18b Dispensing Units
20 UV Curing Module
21 Coating System
22 Suction Unit
24 Drying unit
26 Laser Scanning Area
28 Printing Area
30 Post Processing System
32 Transport Unit
34 Transport Unit
36 Central Opening in Suction Unit
38a, 38b Gas Conduits
40a, 40b Openings
42 Drawer Mechanism
44a, 44b Fluid Reservoirs
45 Injection Cell
46 Needle
48 Injection Cup
50 Probes
52 3D Sensor
54a, 54b Rollers
56 Motor
58a, 58b Rollers
60 Gap
62 Coating
64 Syringe
66 Dispensed Material
68 Closed Cell
70 Knife
100 System with Non-Translatable Donor Module
101 System with Translatable Donor Module

What is claimed is:

1. A system comprising dispensing system, a laser and a donor module with a donor substrate and a coating system, the donor substrate and the coating system of the donor module configured to laterally translate between (i) a coating area where the coating system is configured to coat the donor substrate of the donor module with a material dispensed from the dispensing system, and (ii) a printing area where the laser is used to deposit the material from the donor substrate onto a sample.

2. The system of claim 1, wherein the coating system is configured to create a uniform layer of the material on the donor substrate.

3. The system of claim 1, wherein the coating system comprises:
rollers or knives that define a gap; and
a motor for moving the donor substrate through the gap so as to create a uniform layer of the material with a thickness defined by a height of the gap.

4. The system of claim 3, wherein the rollers or knives are configured to increase the height of the gap after the donor substrate has been coated with the material and prior to translating the donor substrate from the coating area to the printing area.

5. The system of claim 1, wherein the dispensing system is located inside a closed cell with a controlled environment so as to prolong a pot life of the material.

6. The system of claim 1, wherein the dispensing system is configured to dispense two materials onto the donor substrate.

7. The system of claim 1, wherein the dispensing system contains more than one material so as to deposit more than one material in a controlled sequence onto the donor substrate.

8. The system of claim 1, wherein the material comprises: (i) a polymer material or (ii) a mixture of the polymer material and a monomer material.

9. The system of claim 1, wherein the material is a metal paste, a solder paste, or a ceramic paste.

10. The system of claim 1, wherein the material is a high viscosity material, a low viscosity material, a wax material, a heat sensitive material, or a light sensitive material.

11. The system of claim 1, wherein the material is curable by ultraviolet (UV) light or by heat.

12. The system of claim 1, wherein the donor substrate comprises a transparent film substrate that is translated using rollers.

13. The system of claim 12, wherein the transparent film substrate comprises (i) a metal layer, or (ii) the metal layer and a dielectric layer.

14. The system of claim 1, further comprising one or more of (i) an ultraviolet (UV) light source configured to cure the deposited material using UV light or (ii) a heater configured to cure the deposited material using heat.

15. The system of claim 1, further comprising one or more cameras configured to inspect a surface of the sample.

16. The system of claim 1, further comprising a drying unit and a suction unit, the drying unit configured to dry the deposited material while the suction unit removes heated air produced by the drying unit.

17. The system of claim 1, further comprising a suction unit, wherein the laser is further configured to ablate the deposited material so as to increase a resolution of the deposited material while the suction unit is used to remove debris created by the ablation of the deposited material.

18. The system of claim 1, further comprising a suction unit, wherein the laser is further configured to sinter the deposited material so as to increase a conduction of the deposited material while the suction unit is used to remove debris created by the sintering of the deposited material.

* * * * *